(12) United States Patent
Takekawa et al.

(10) Patent No.: US 7,119,555 B2
(45) Date of Patent: Oct. 10, 2006

(54) CIRCUIT FOR DETECTING DIFFERENCE IN CAPACITANCE

(75) Inventors: Koji Takekawa, Kasugai (JP); Takehito Doi, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/981,795

(22) Filed: Nov. 5, 2004

(65) Prior Publication Data

US 2006/0017449 A1    Jan. 26, 2006

(30) Foreign Application Priority Data

Jul. 20, 2004    (JP) ............................. 2004-212025

(51) Int. Cl.
  *G01R 27/26* (2006.01)
(52) U.S. Cl. ........................ 324/683; 324/679
(58) Field of Classification Search ................ 324/683, 324/679
  See application file for complete search history.

(56) References Cited

U.S. PATENT DOCUMENTS

| | | | | |
|---|---|---|---|---|
| 3,896,374 A | * | 7/1975 | Delafon | ...................... 324/681 |
| 5,394,097 A | * | 2/1995 | Bechtel et al. | ............... 324/687 |
| 5,659,254 A | * | 8/1997 | Matsumoto et al. | ......... 324/678 |
| 5,744,968 A | * | 4/1998 | Czarnocki et al. | ........... 324/608 |
| 6,304,091 B1 | * | 10/2001 | Shahoian et al. | ........... 324/662 |
| 2005/0253596 A1 | * | 11/2005 | Kitano et al. | ................ 324/658 |

FOREIGN PATENT DOCUMENTS

| | | | |
|---|---|---|---|
| JP | 07029694 A | * | 1/1995 |
| JP | 9-229784 | | 9/1997 |
| JP | 10-227644 | | 8/1998 |

* cited by examiner

Primary Examiner—Anjan Deb
(74) Attorney, Agent, or Firm—Arent Fox PLLC

(57) ABSTRACT

A circuit for detecting a difference in capacitance between a first capacitor and a second capacitor provided in a sensor includes an oscillator configured to generate an oscillating signal, a phase comparator coupled to the oscillator to output a signal responsive to a phase difference between the oscillating signal delayed by the first capacitor and the oscillating signal delayed by the second capacitor, an integration circuit coupled to the phase comparator to output an integrated signal made by integrating the signal responsive to the phase difference over a time period equal to a predetermined number of cycles of the oscillating signal, and a sample-and-hold circuit coupled to the integration circuit to output a signal made by sampling and holding the integrated signal at substantially an end of the time period.

4 Claims, 28 Drawing Sheets

CIRCUIT FOR DETECTING DIFFERENCE IN CAPACITANCE

CROSS-REFERENCE TO RELATED APPLICATIONS

The present application is based upon and claims the benefit of priority from the prior Japanese Patent Application No. 2004-212025 filed on Jul. 20, 2004, with the Japanese Patent Office, the entire contents of which are incorporated herein by reference.

BACKGROUND OF THE INVENTION

1. Field of the Invention

The present invention generally relates to detection circuits which detect a minute change in capacitance responsive to a physical parameter for the purpose of measuring the physical parameter, and particularly relates to a detection circuit which detects a relative difference in the capacitances of a plurality of capacitors.

2. Description of the Related Art

Sensors that detect a minute change in the capacitance of a capacitor to measure a physical quantity causing such a capacitance change include a pressure sensor, an acceleration sensor, an angular rate sensor (gyroscope), etc. FIG. 1 is an illustrative drawing showing an example of the construction of a pressure sensor. A beam 13 provided inside a casing 10 for the pressure sensor partitions the interior of the casing 10 into a measured pressure room 14 in an upper half and a reference pressure room 15 in a lower half. Openings 10a and 10b are provided for the measured pressure room 14, thereby connecting an external gas pressure with an internal gas pressure inside the measurement pressure room 14. The reference pressure room 15 is sealed, and is filled with gas that generates a reference pressure. A detection electrode 11 provided on an inner wall of the casing 10 and a detection electrode 12 provided at a portion supported by the beam 13 constitute a capacitor comprised of a pair of opposing electrodes. A rise in the external pressure causes a pressure inside the measurement pressure room 14 to become greater than the pressure of the reference pressure room 15, thereby pressing down a portion of the beam 13 that is elastic, as shown in FIG. 2. This results in a capacitance change. Such capacitance change is electrically detected to measure the pressure.

A pressure sensor is generally implemented by use of a single capacitor as shown in FIG. 1. When calculating speed based on a difference between a static pressure (atmospheric pressure) and a dynamic pressure (pressure applied in the travel direction) as in an airplane or the like, two sensors each as shown in FIG. 1 are provided, and a relative difference between the capacitances of the two capacitors is detected. Accordingly, there is a need for a circuit that can accurately detect a relative difference in capacitance.

FIG. 3 is an illustrative drawing showing an example of the construction of an acceleration sensor. Detection electrodes 21a and 21b provided on an inner wall of a casing 20 for the acceleration sensor and detection electrodes 22a and 22b provided at a portion supported by a beam 23 constitute two capacitors comprised of two pairs of opposing electrodes. An weight 24 for use in detecting acceleration is attached to the beam 23. When acceleration is present, the weight 24 supported by the elastic beam 23 swings around the supporting point, tilting in response to acceleration as shown in FIG. 4. This causes a change in the relative capacitances of the two capacitors. This relative capacitance change is electrically detected to measure the acceleration. Accordingly, there is a need for a circuit that can accurately detect a relative difference in capacitance.

FIG. 5 is an illustrative drawing showing an example of the construction of an angular rate sensor (gyroscope). Electrodes 31a through 31c provided on an inner wall of a casing 30 for the angular rate sensor (gyroscope) and electrodes 32a through 32c provided at a portion supported by a beam 33 constitute three capacitors comprised of three pairs of opposing electrodes. The electrodes 31a and 31c and the electrode 32a and 32c are detection electrodes, and changes in the capacitances of the two capacitors formed by these electrodes are detected to measure angular rate. The central electrode 31b and the central electrode 32b are drive electrodes. They receive an alternating voltage to cause a simple harmonic motion of the weight 34 attached to the elastic beam 33 in a vertical direction as shown by an arrow A.

When angular rate is present with respect to the angular rate sensor (gyroscope), a Coriolis is applied to the weight 34 that is exhibiting a simple harmonic motion. As a result, as shown in FIGS. 6A and 6B, the weight 34 tilts in response to the Coriolis force. Even when the angular rate is constant and maintains the same direction, a Coriolis force applied to the weight 34 that is moving downward (FIG. 6A) is in a different direction than a Coriolis force applied to the weight 34 that is moving upwards (FIG. 6B). Because of this, the side toward which the weight 34 tilts varies depending on whether the movement is upward or downward. Relative capacitance changes generated in this manner is electrically detected to measure the angular rate. Accordingly, there is a need for a circuit that can accurately detect a relative difference in capacitance.

FIG. 7 is a circuit diagram showing an example of the construction of a detection circuit that detects a relative capacitance difference in the case of an acceleration sensor. The detection circuit of FIG. 7 includes an oscillator 40, buffers 41 and 42, an XOR gate 43, and a low-pass filter 44.

FIG. 8 is a signal waveform diagram for explaining the operation of the detection circuit of FIG. 7. Signals A through E shown in FIG. 8 are identified with their respective positions in the circuit of FIG. 7. For the sake of convenience of explanation, signal waveforms B' and C' having cleaner shapes equivalent to the signals B and C are also illustrated. When the oscillator 40 of FIG. 7 generates the signal A comprised of repeated pulses as shown in FIG. 8, the signals B and C output from the respective buffers 41 and 42 are delayed according to the capacitances of the respective capacitors 45 and 46. The way such a delay occurs is shown as the time differences of rising edges and falling edges between the cleaner shaped signals B' and C' equivalent to the signals B and C.

The XOR gate 43 performs an exclusive logical sum between the signals B and C, thereby generating the pulse signal D having a pulse width responsive to the delay time difference. The low-pass filter 44 integrates the pulse signal D, thereby generating a DC voltage having a voltage responsive to the delay time difference. This delay time difference is attributable to a capacitance difference between the capacitors 45 and 46, which is in turn responsive to acceleration. Accordingly, the DC voltage output from the low-pass filter 44 has a voltage level responsive to the acceleration. [Patent Document 1] Japanese Patent Application Publication No. 9-229784 [Patent Document 2] Japanese Patent Application Publication No. 10-227644

In sensors such as a pressure sensor, an acceleration sensor, an angular rate sensor (gyroscope), etc., a generated capacitance difference responsive to a physical quantity to be measured is minute. A conventional detection circuit such as that shown in FIG. 7 has a problem in that acceleration or the like cannot be accurately measured because a change in the output DC voltage becomes small when a capacitance change is small.

Accordingly, there is a need for a detection circuit which can accurately detect a minute capacitance difference.

SUMMARY OF THE INVENTION

It is a general object of the present invention to provide a detection circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a detection circuit particularly pointed out in the specification in such full, clear, concise, and exact terms as to enable a person having ordinary skill in the art to practice the invention.

To achieve these and other advantages in accordance with the purpose of the invention, the invention provides a circuit for detecting a difference in capacitance between a first capacitor and a second capacitor provided in a sensor, the circuit including an oscillator configured to generate an oscillating signal, a phase comparator coupled to the oscillator to output a signal responsive to a phase difference between the oscillating signal delayed by the first capacitor and the oscillating signal delayed by the second capacitor, an integration circuit coupled to the phase comparator to output an integrated signal made by integrating the signal responsive to the phase difference over a time period equal to a predetermined number of cycles of the oscillating signal, and a sample-and-hold circuit coupled to the integration circuit to output a signal made by sampling and holding the integrated signal at substantially an end of the time period.

According another aspect of the invention, a circuit for detecting a difference in capacitance between a first capacitor and a second capacitor provided in a sensor includes a first oscillator configured to generate a first oscillating signal having frequency responsive to the first capacitor, a second oscillator configured to generate a second oscillating signal having frequency responsive to the second capacitor, a first counter coupled to the first oscillator to output a first count responsive to the first oscillating signal, a second counter coupled to the second oscillator to output a second count responsive to the second oscillating signal, and an operation circuit coupled to the first counter and the second counter to output a signal indicative of the difference in capacitance in response to the first count and the second count.

According to at least one embodiment of the invention, the integrated signal is an accumulation of the signal responsive to the phase difference over the time period equal to the predetermined number of cycles of the oscillating signal. Accordingly, the signal made by sampling and holding this integrated signal is an indication of a total of the phase differences within the time period equal to the predetermined number of cycles in every predetermined number of cycles of the oscillating signal. In this manner, when detecting a potential responsive to a phase difference, i.e., when detecting a potential responsive to a capacitance difference, the potential responsive to the capacitance difference is integrated over the period corresponding to a predetermined number of cycles. This makes it possible to generate a signal having less noise, thereby achieving accurate detection of a capacitance difference.

According to at least one embodiment of the invention, the difference in capacitance is obtained based on the first count and the second count, so that there is an integrating effect (averaging effect) brought about by the integration of capacitances over the counting time period, thereby achieving highly accurate measurement. Moreover, since measurement is based on digital computation, it is less susceptible to noise and circuit characteristics, compared with measurement based on analog values such as a voltage level. Further, measurement based on digital computation allows error correction to be easily performed.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 9:
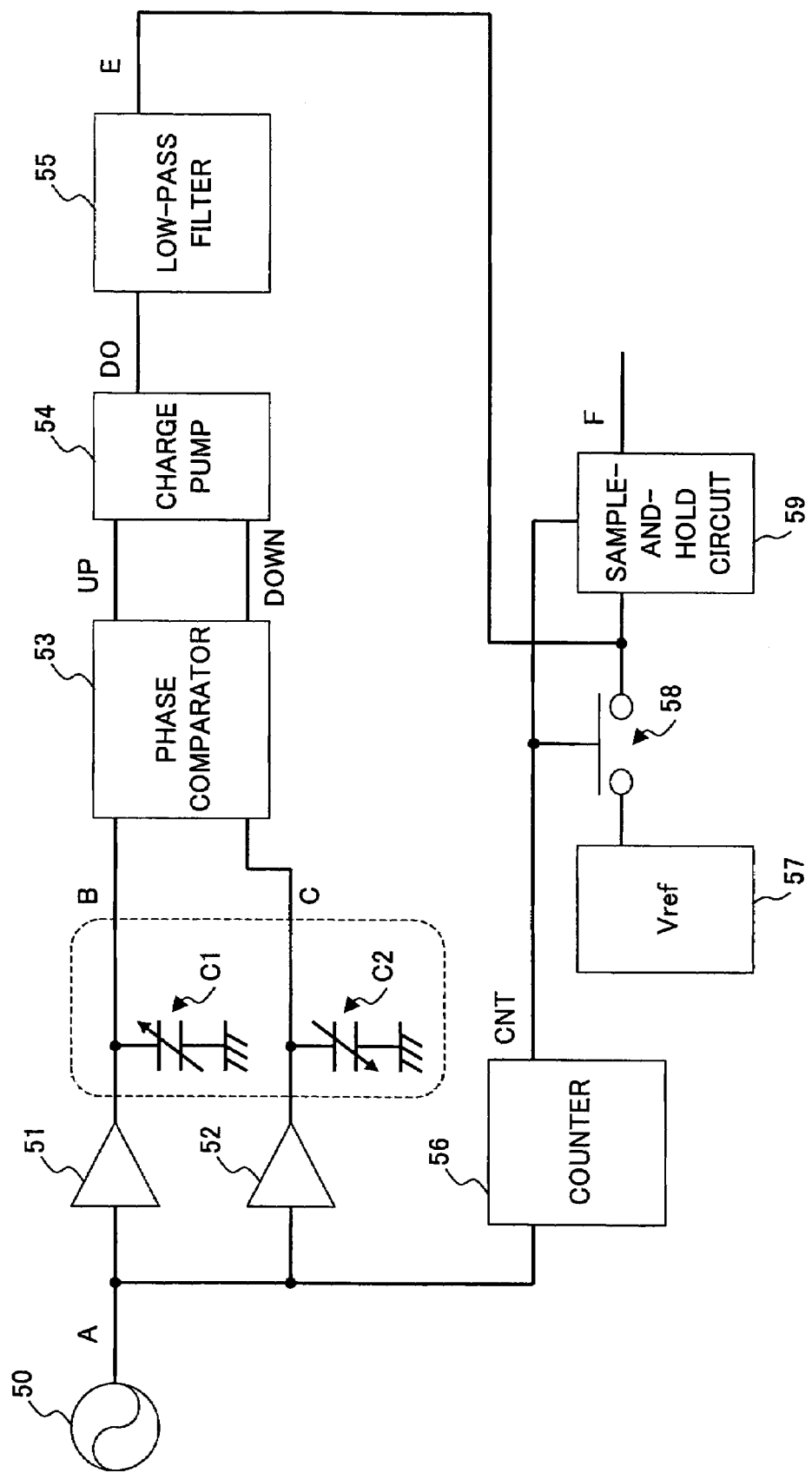
FIG. 9 is an illustrative drawing showing an example of the construction of a first embodiment of a detection circuit according to the present invention.

FIG. 9 is an illustrative drawing showing an example of the construction of a first embodiment of a detection circuit according to the present invention. The detection circuit of FIG. 9 serves to detect a minute capacitance difference occurring in a sensor such as a pressure sensor or an acceleration sensor that requires no sensor-driven vibration. In later embodiments, a description will be given of a detection circuit for use with a sensor such as an angular rate sensor (gyroscope) that requires sensor-driven vibration.

Figure 10:
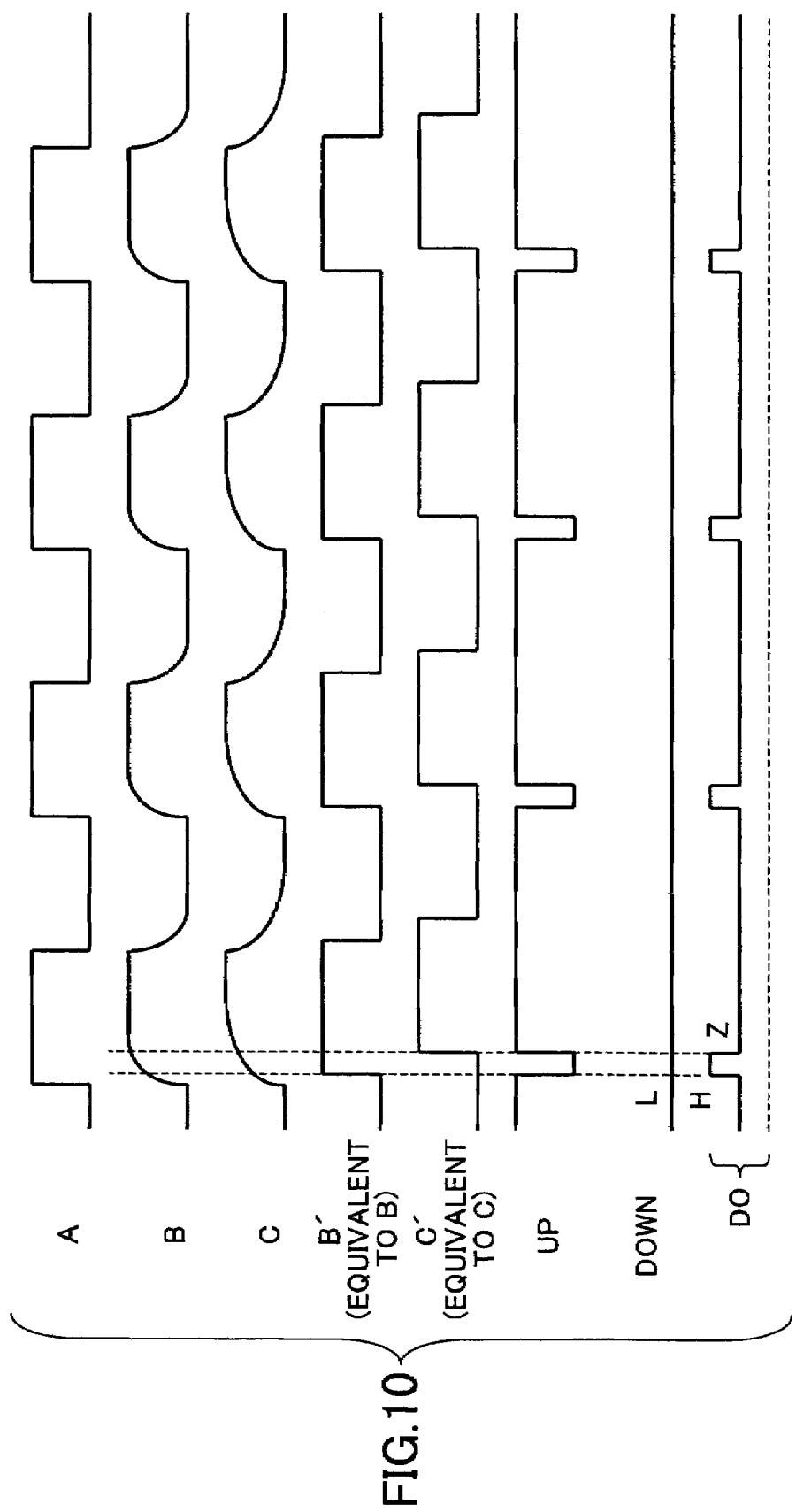
FIG. 10 is a signal waveform diagram for explaining the operation of the detection circuit of FIG. 9.
Figure 11:
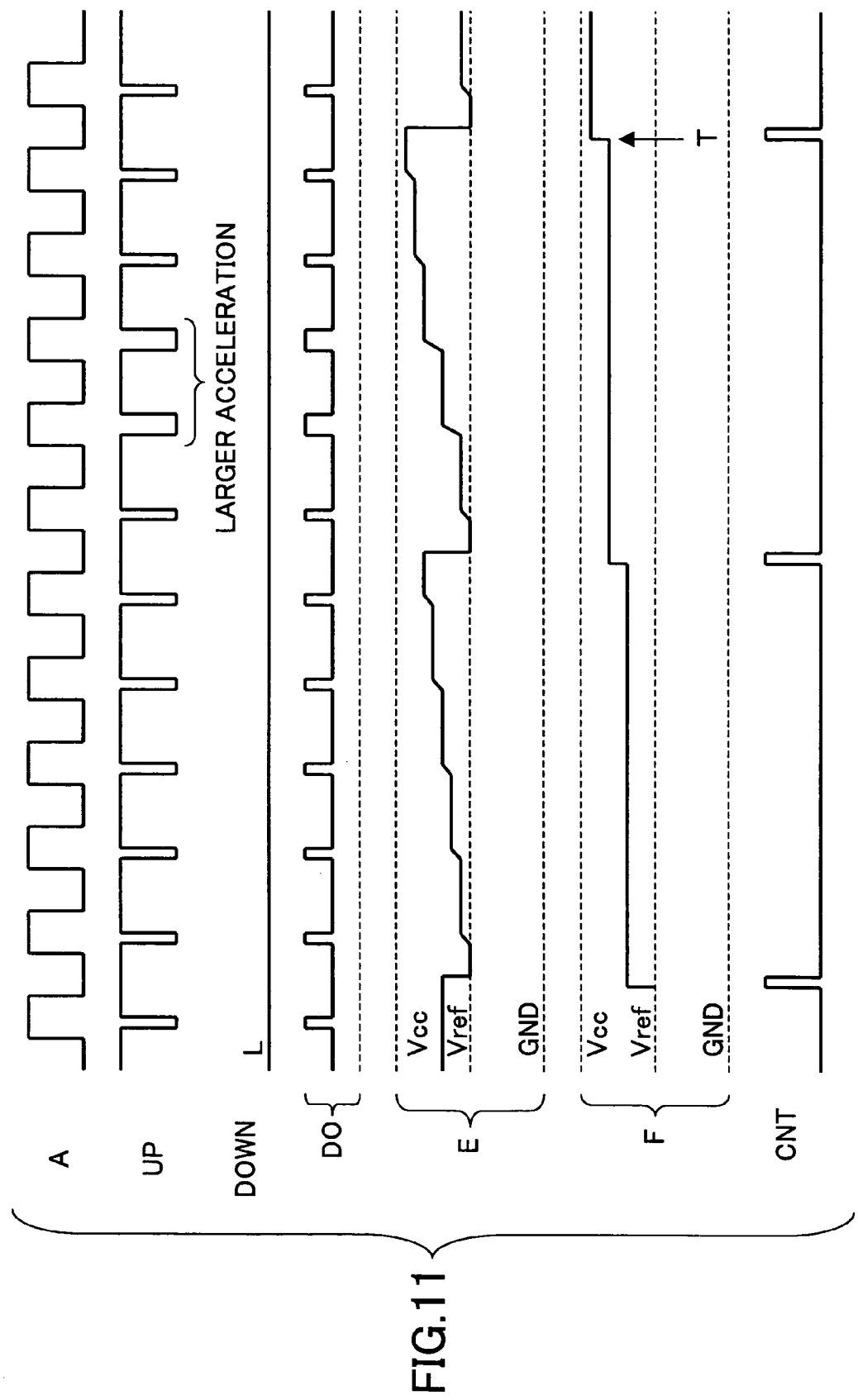
FIG. 11 is a signal waveform diagram for explaining the operation of the detection circuit of FIG. 9.

The detection circuit of FIG. 9 includes an oscillator 50, buffers 51 and 52, a phase comparator 53, a charge pump 54, a low-pass filter 55, a counter 56, a reference voltage generating circuit (Vref) 57, a switch 58, and a sample-and-hold circuit 59. FIGS. 10 and 11 are signal waveform diagrams for explaining the operation of the detection circuit of FIG. 9. Signals A through F, UP, DOWN, DO and CNT shown in FIGS. 10 and 11 are identified with their respective positions in the circuit of FIG. 9. For the sake of convenience of explanation, signal waveforms B' and C' having cleaner shapes equivalent to the signals B and C are also illustrated.

When the oscillator 50 of FIG. 9 generates the signal A comprised of repeated pulses as shown in FIG. 10, the signals B and C output from the respective buffers 51 and 52 are delayed according to the capacitances of the respective capacitors C1 and C2. The way such a delay occurs is shown in FIG. 10 as the time differences of rising edges and falling edges between the cleaner shaped signals B' and C' equivalent to the signals B and C. In this example, the capacitance C2 is larger than the capacitance C1, so that the signal C has a longer delay than the signal B.

The phase comparator 53 compares the phases of the signal B and the signal C. The phase comparator 53 asserts the signal UP when the phase of the signal B is earlier than the phase of the signal C, and asserts the signal DOWN when the phase of the signal B is later than the phase of the signal C. In this example, the phase of the signal B is earlier than the phase of the signal C, so that the signal UP is asserted as shown in FIG. 10. It should be noted that the signal UP is a negative logic signal whereas the signal DOWN is a positive logic signal.

The charge pump 54 outputs the signal DO, which can assume any of the three signal states, i.e., HIGH, LOW, and the floating state (HIGH impedance state) Z. The signal DO is a HIGH pulse having the same width as the signal UP when the signal UP is input, and is a LOW pulse having the same width as the signal DOWN when the signal DOWN is input. When neither the signal UP nor the signal DOWN is input, the signal DO is placed in the floating state. In the example of FIG. 10, the signal DO is comprised of HIGH pulses having the same width as the signal UP.

The low-pass filter 55 integrates the signal DO to generate a DC voltage having a voltage level responsive to the delay time difference (phase difference). In the example shown in FIG. 11, the signal DO is comprised of HIGH pulses, so that the signal E output from the low-pass filter 55 gradually increases its voltage level. The counter 56 outputs a single HIGH pulse of the signal CNT when five pulses of the signal A are input from the oscillator 50. The signal CNT controls the switch 58. If the signal CNT is set to HIGH, then, the switch 58 is closed and the signal E returns to a reference voltage Vref. As a result, the voltage change of the signal E is reset once in every five pulses of the signal A.

The sample-and-hold circuit 59 samples the potential of the signal E each time a pulse of the signal CNT arrives, and holds the sampled value until a next pulse of the signal CNT. The sampled-&-held voltage level is shown as the signal F. In the example of FIG. 11, acceleration exhibits a temporal surge in the latter half of the illustrated period, resulting in increases in the pulse widths of the signal UP and signal DO. In response, the voltage level of the signal E rises above the level of the previous sample, so that the signal F obtained by a sample-&-hold process also rises at timing T.

The signal F after the sample-&-hold process is the output signal of the detection circuit. As can be understood from the above description, the signal E is an accumulation of successive pulses responsive to the phase difference in every five cycles of the signal A. Accordingly, the signal F obtained by sampling and holding the signal E is an indication of a total of the phase differences within a five-cycle period in every five cycles of the signal A. In this manner, when detecting a potential responsive to a phase difference, i.e., when detecting a potential responsive to a capacitance difference, the potential responsive to the capacitance difference is integrated over the period corresponding to a predetermined number of cycles. This makes it possible to generate a signal having less noise, thereby achieving accurate detection of a capacitance difference.

Figure 12:
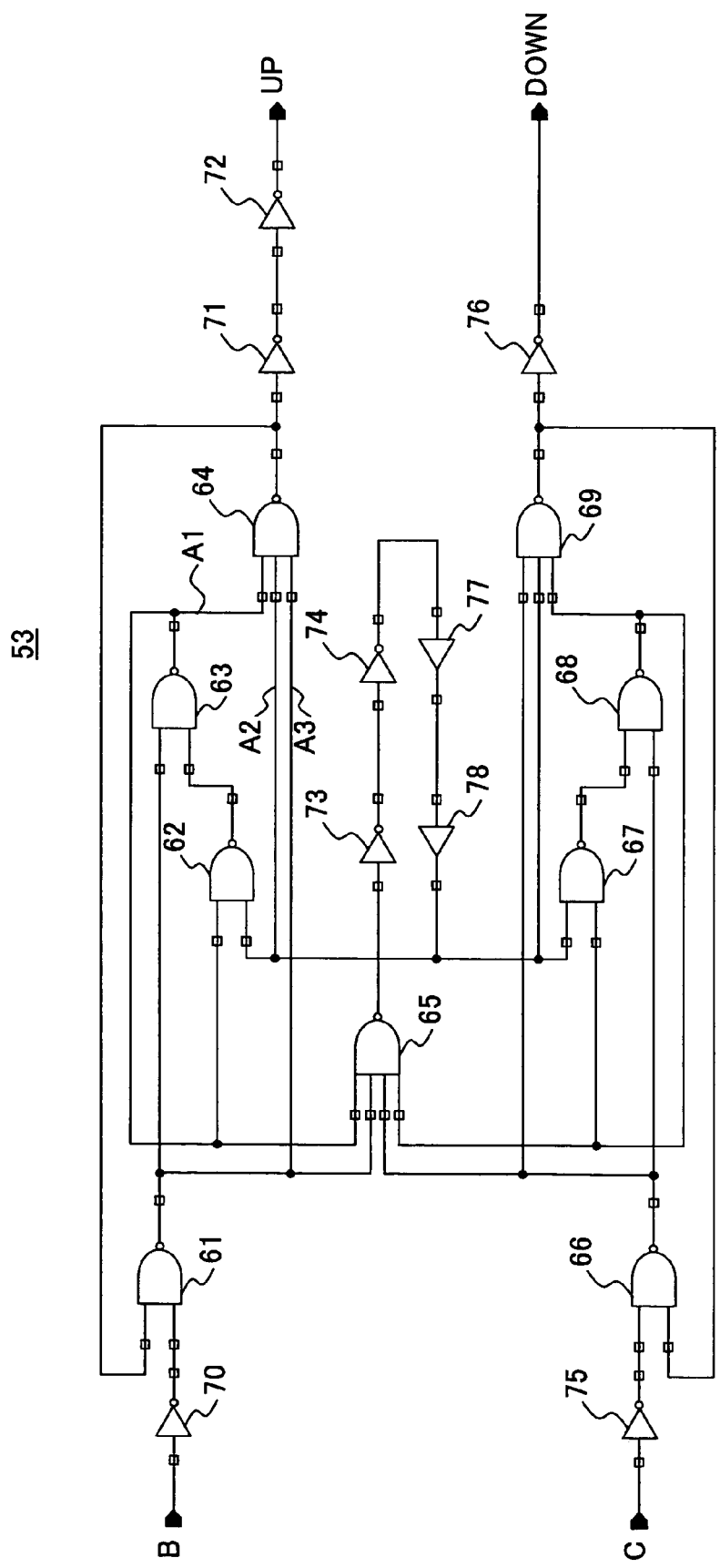
FIG. 12 is a circuit diagram showing an example of the circuit construction of a phase comparator.

FIG. 12 is a circuit diagram showing an example of the circuit construction of the phase comparator 53. The phase comparator 53 of FIG. 12 includes NAND circuit 61 through 69, inverters 70 and 76, and buffers 77 and 78.

An output UP of the phase comparator 53 is a negative logic signal, and an output DOWN is a positive logic signal. That is, the output UP usually stays at HIGH, and becomes LOW at the time of assertion. Moreover, the output DOWN usually stays at LOW, and becomes HIGH at the time of assertion.

If a rising edge of the signal B comes ahead of a rising edge of the signal C, the output of the NAND circuit 61 becomes HIGH. Although details are not described here, signals A1 and A2 are initially placed in the HIGH state. When a signal A3 (the output of the NAND circuit 61) is changed to HIGH, the output of the NAND circuit 64 becomes LOW, thereby changing the signal UP to LOW for assertion. A positive transition of the signal C arrives thereafter, causing the output of the NAND circuit 66 to change to HIGH. This HIGH signal causes the output of the NAND circuit 65 to change to LOW, resulting in the signal A2 being LOW, which returns the signal UP to HIGH. In this manner, when a rising edge of the signal B is leading ahead, the signal UP is asserted for the period from the rising edge of the signal B to the corresponding rising edge of the signal C. When a rising edge of the signal C is leading ahead, on the other hand, the signal DOWN is asserted for the period from the rising edge of the signal C to the corresponding rising edge of the signal B.

In FIG. 9, an XOR gate (exclusive-logical-sum gate) may be used in place of the phase comparator 53. When an XOR gate is used, however, the operation would be only proper for phase differences within the ±180-degree range. When the phase comparator as shown in FIG. 9 is used, on the other hand, the operation is also proper for phase differences exceeding the ±180-degree range.

Figure 13:
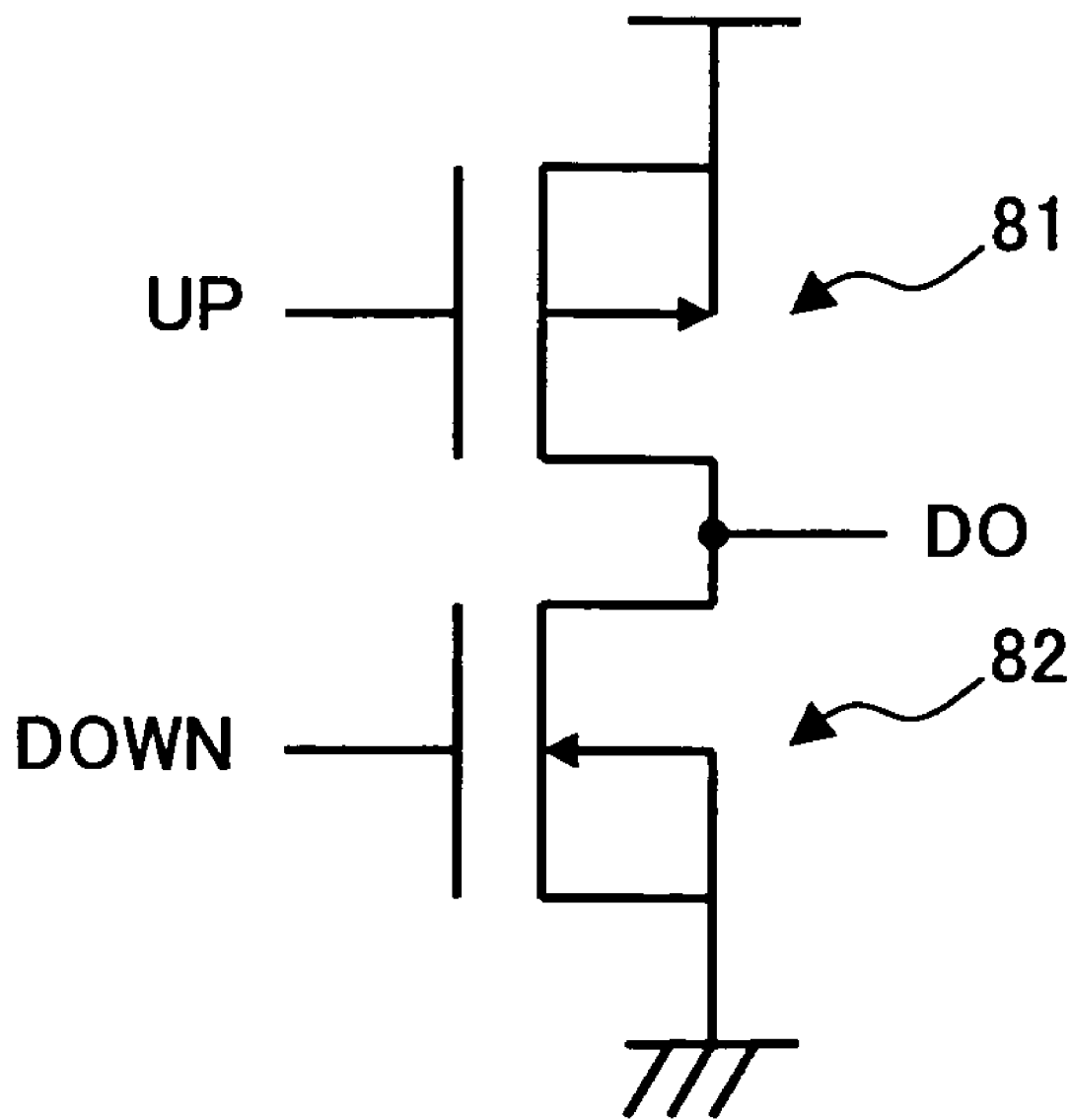
FIG. 13 is a circuit diagram showing an example of the circuit construction of a charge pump.

FIG. 13 is a circuit diagram showing an example of the circuit construction of the charge pump 54. The charge pump 54 of FIG. 13 includes a PMOS transistor 81 and an NMOS transistor 82. The gate of the PMOS transistor 81 receives the signal UP, and the gate of the NMOS transistor 82 receives the signal DOWN. When the signal UP changes to LOW for assertion, the PMOS transistor 81 becomes conductive, resulting in the signal DO being HIGH. When the signal DOWN changes to HIGH for assertion, the NMOS transistor 82 becomes conductive, resulting in the signal DO being LOW. Otherwise, the signal DO is kept in the floating state.

Figure 14:
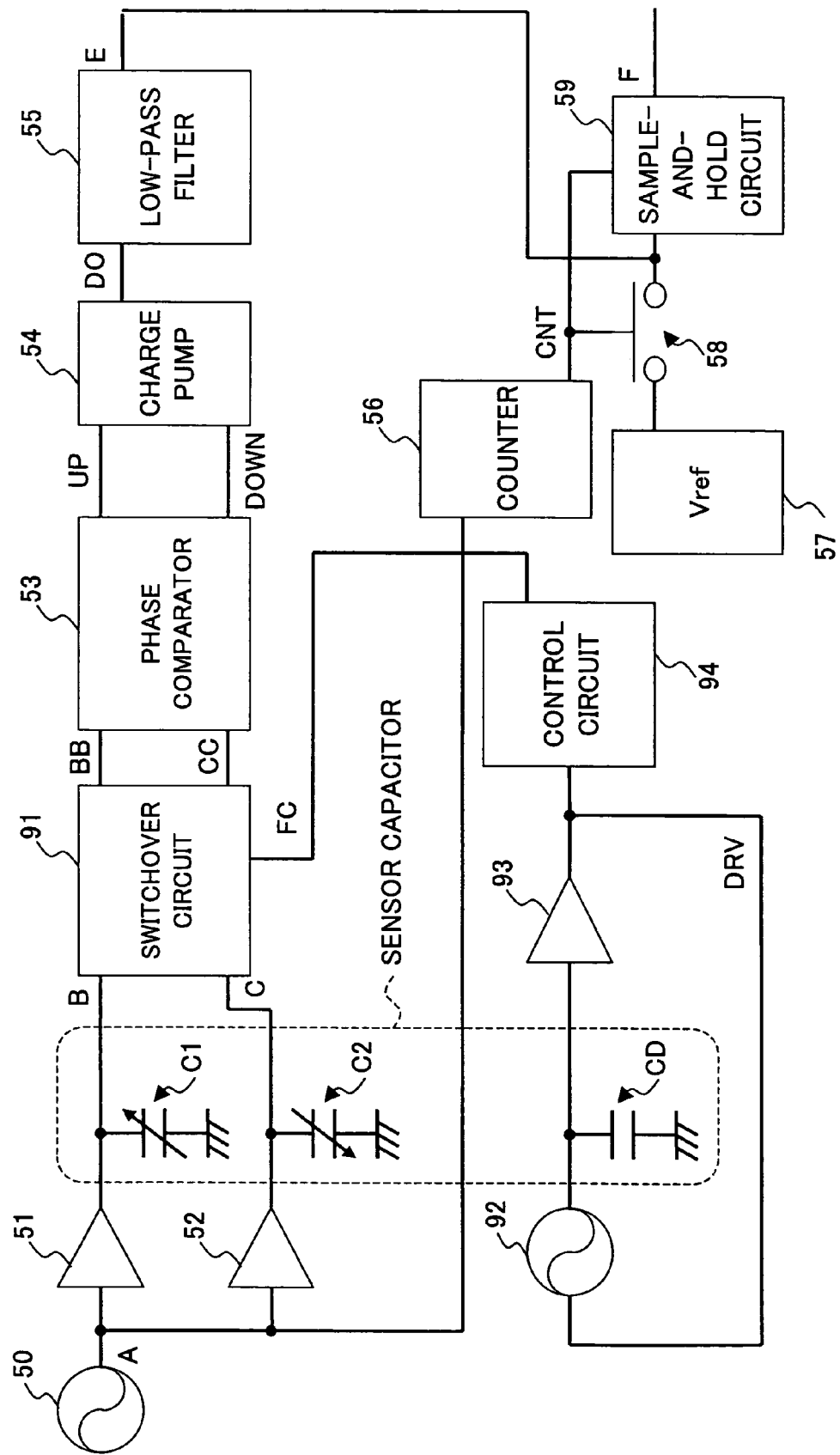
FIG. 14 is a block diagram showing an example of the construction of a second embodiment of the detection circuit according to the present invention.

FIG. 14 is a block diagram showing an example of the construction of a second embodiment of the detection circuit according to the present invention. The detection circuit of FIG. 14 is used for a sensor such as an angular rate sensor (gyroscope) that requires sensor-driven vibration. In FIG. 14, the same elements as those of FIG. 9 are referred to by the same numerals, and a description thereof will be omitted.

Figure 1:
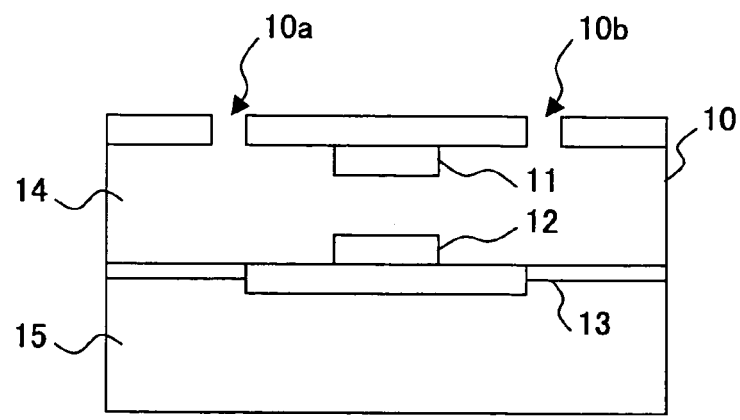
FIG. 1 is an illustrative drawing showing an example of the construction of a pressure sensor.
Figure 2:
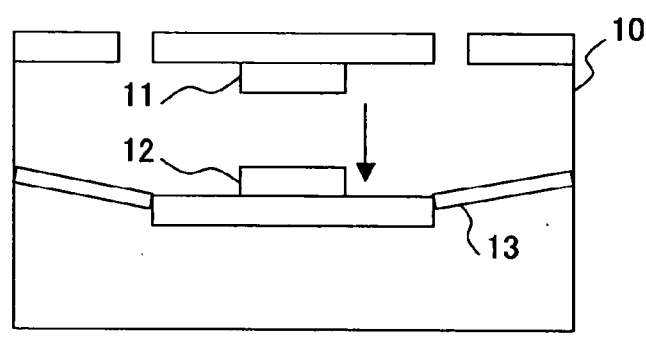
FIG. 2 is an illustrative drawing showing the pressure sensor of FIG. 1 in which the beam portion is pressed down by a pressure.
Figure 3:
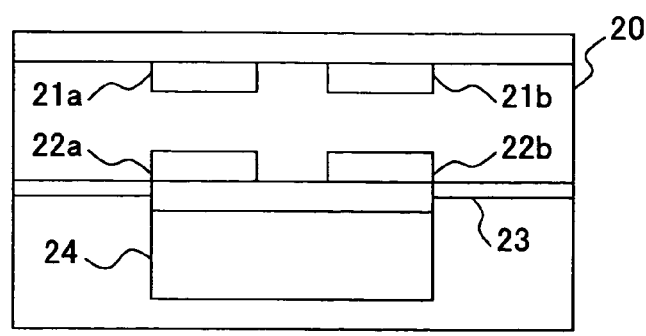
FIG. 3 is an illustrative drawing showing an example of the construction of an acceleration sensor.
Figure 4:
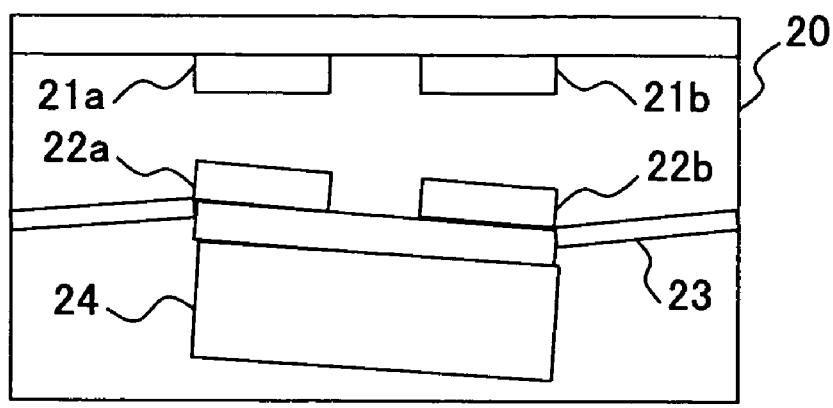
FIG. 4 is an illustrative drawing showing the acceleration sensor of FIG. 3 in which the weight is tilting in response to acceleration.
Figure 5:
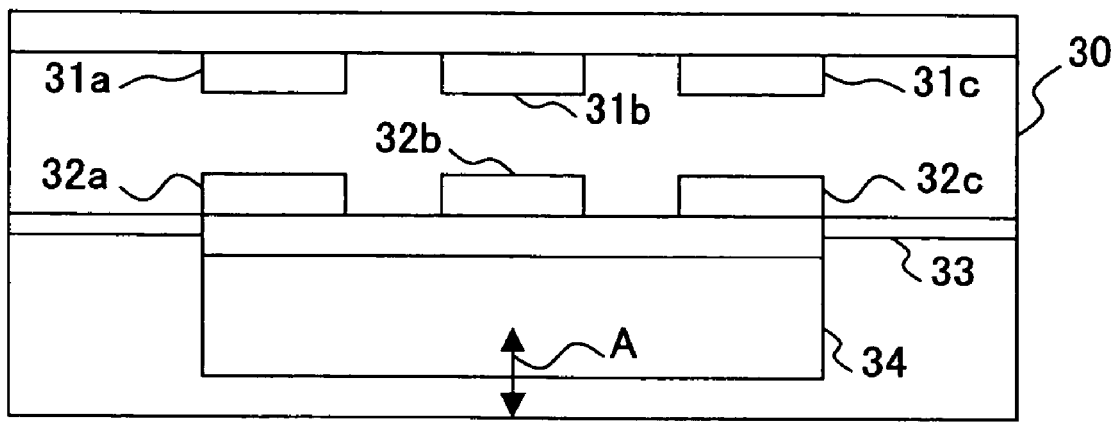
FIG. 5 is an illustrative drawing showing an example of the construction of an angular rate sensor (gyroscope)
Figure 6A:
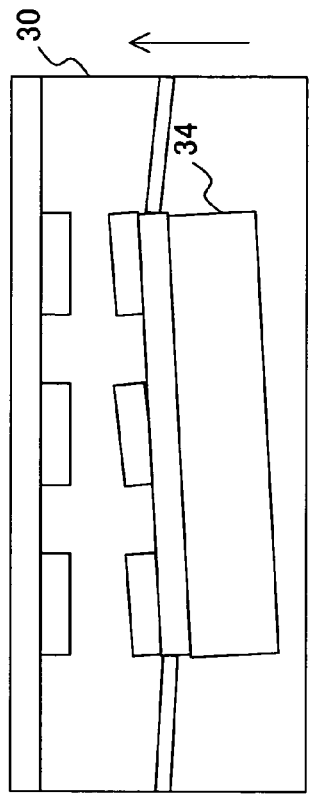
FIGS. 6A and 6B are illustrative drawings showing the angular rate sensor (gyroscope) of FIG. 5 in which the weight tilts toward different sides depending on which way the weight is moving.
Figure 6B:
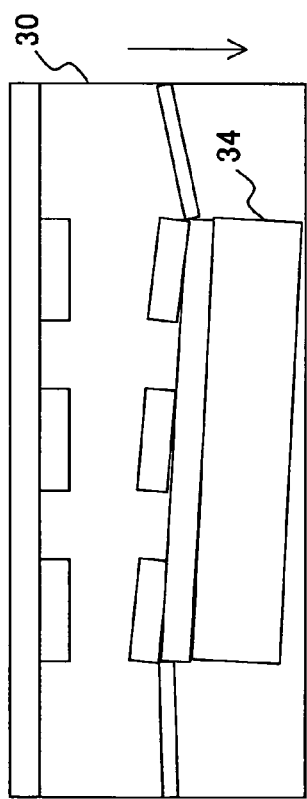
Figure 7:
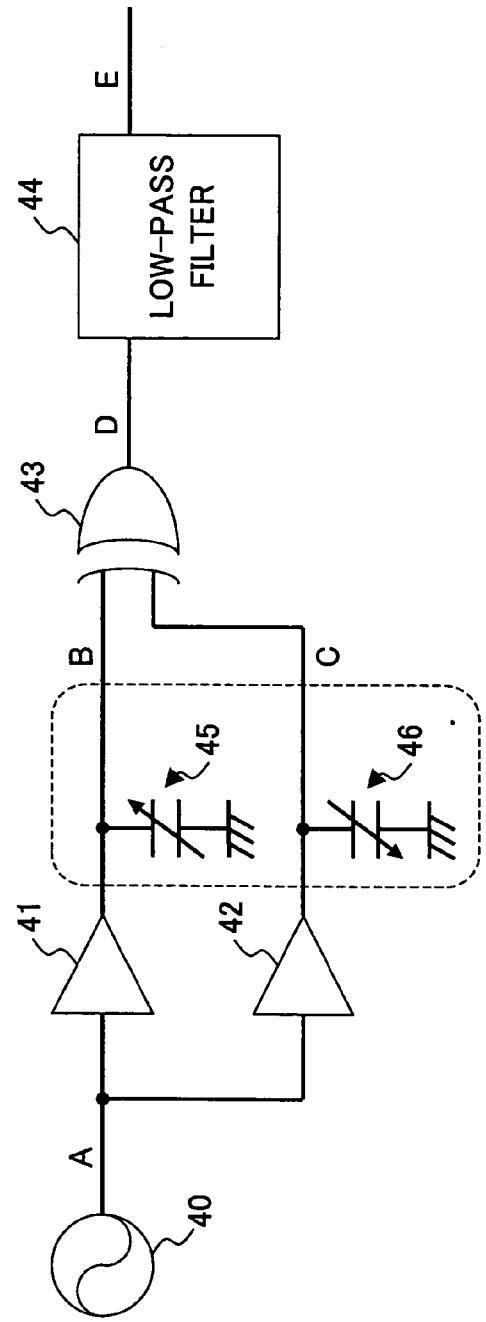
FIG. 7 is a circuit diagram showing an example of the construction of a detection circuit that detects a relative capacitance difference in the case of an acceleration sensor.
Figure 8:
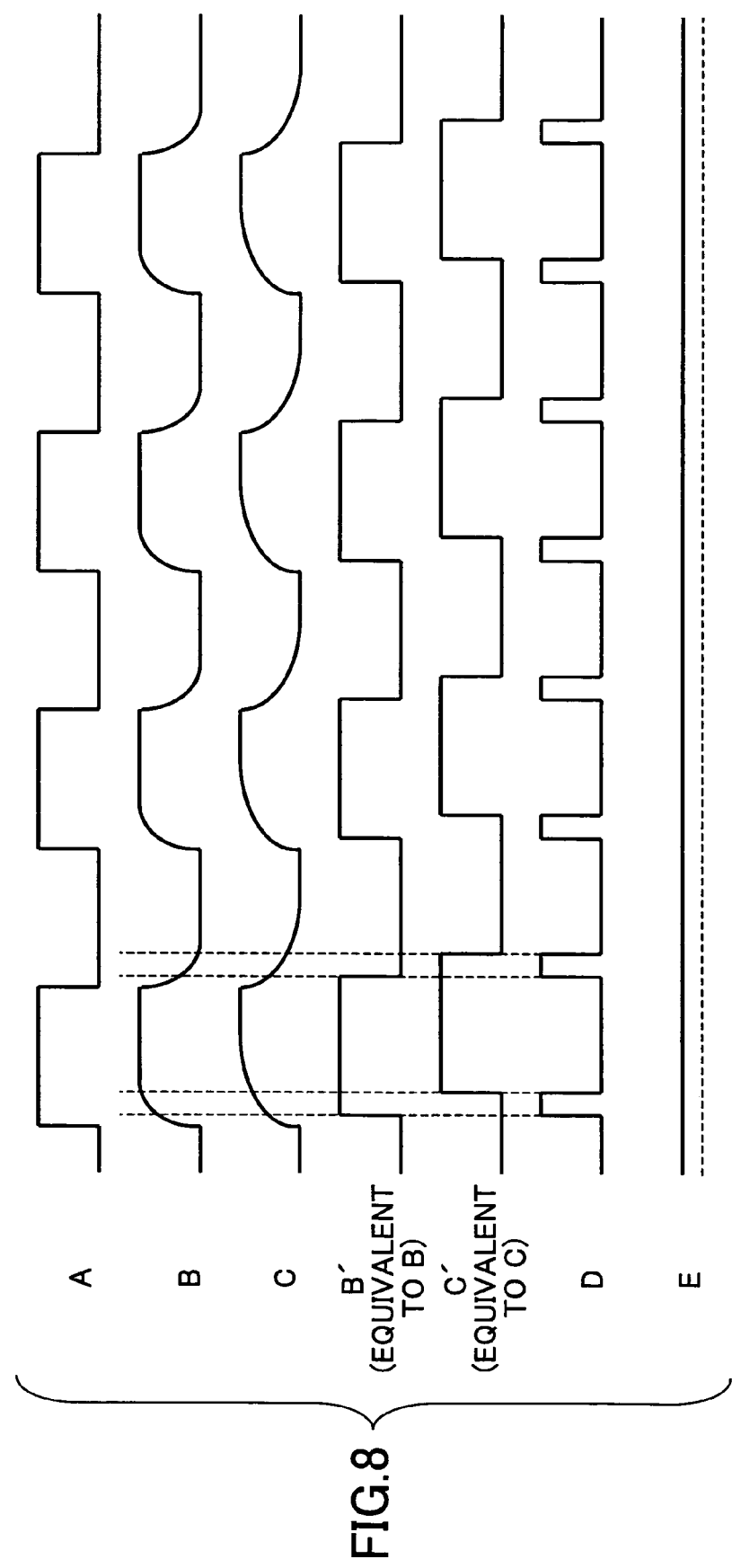
FIG. 8 is a signal waveform diagram for explaining the operation of the detection circuit of FIG. 7.

The detection circuit of FIG. 14 includes the oscillator 50, the buffers 51 and 52, the phase comparator 53, the charge pump 54, the low-pass filter 55, the counter 56, the reference voltage generating circuit (Vref) 57, the switch 58, the sample-and-hold circuit 59, a switchover circuit 91, an oscillator 92, a buffer 93, and a control circuit 94. The oscillator 92 generates an alternating voltage as a drive signal. This drive signal may be a rectangular waveform, or may be a sinusoidal waveform, for example. The drive signal is applied to a drive capacitor CD of the angular rate sensor (gyroscope), thereby causing simple harmonic motion of a weight (34 in FIG. 5) of the angular rate sensor (gyroscope) in the vertical direction. The buffer 93 receives the drive signal, and generates a cyclic pulse signal DRV responsive to the drive signal. The control circuit 94 detects the timing of movement of the weight in a first direction (e.g., downward movement) and the timing of movement of the weight in a second direction (e.g., upward movement) based on the pulse signal DRV. A timing signal FC indicative of the detected timing is supplied to the switchover circuit 91.

Figure 15:
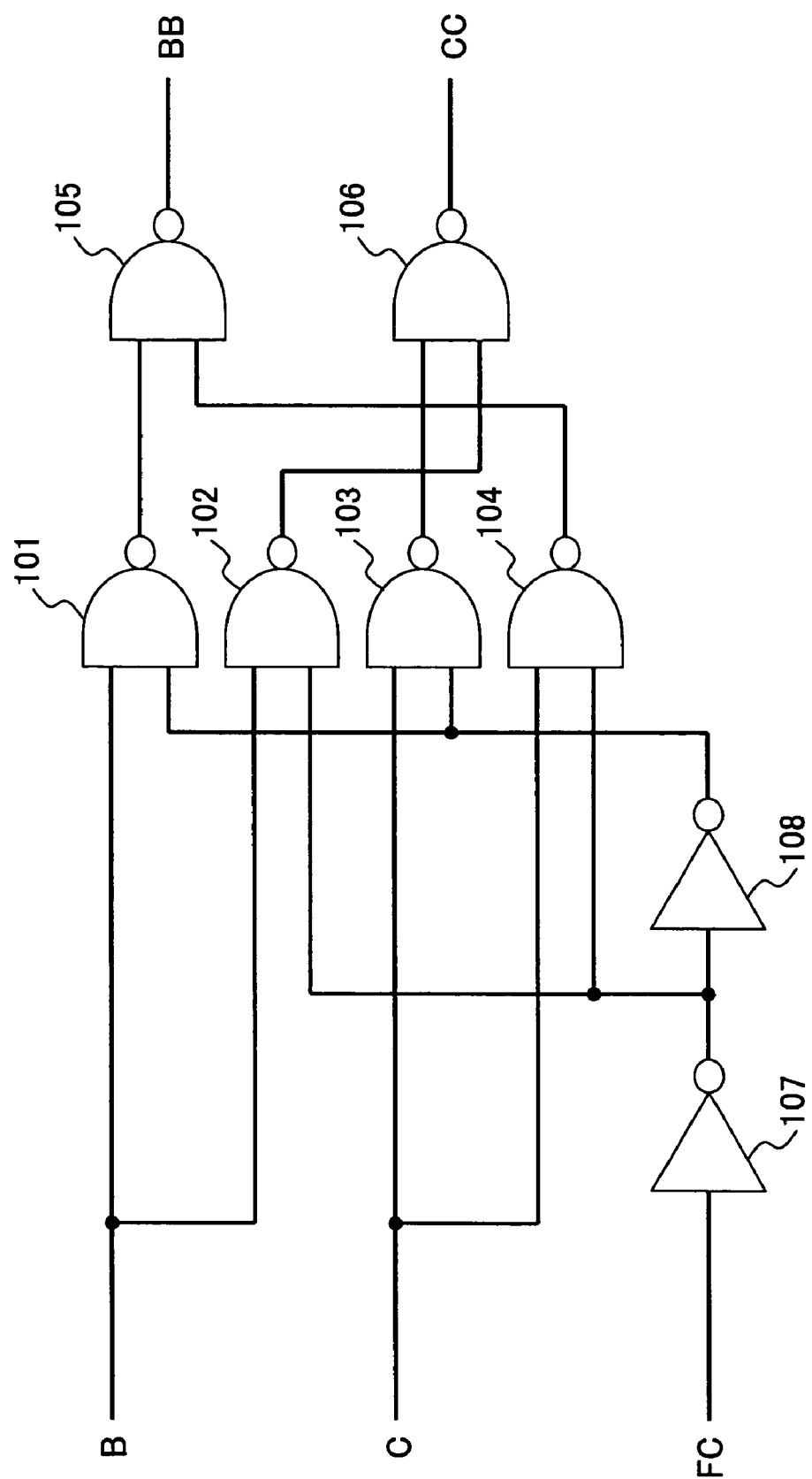
FIG. 15 is a circuit diagram showing an example of the circuit construction of a switchover circuit.

FIG. 15 is a circuit diagram showing an example of the circuit construction of the switchover circuit 91. The switchover circuit 91 of FIG. 15 includes NAND circuits 101 through 106 and inverters 107 and 108. When the timing signal FC is HIGH, the signal B is output as a signal BB through the NAND circuits 101 and 105, and the signal C is output as a signal CC through the NAND circuits 103 and 106. When the timing signal FC is LOW, the signal B is output as the signal CC through the NAND circuits 102 and 106, and the signal C is output as the signal BB through the NAND circuits 104 and 105.

In this manner, the detection circuit of FIG. 14 switches signal correspondences between the signals B and C and the signals BB and CC, depending on whether the weight is moving in the first direction or moving in the second direction. The signals BB and CC obtained in this manner are supplied to the phase comparator 53 for phase comparison. Such switchover operation is necessary because the magnitude relationship between the capacitance C1 and the capacitance C3 is reversed, depending on whether the weight is moving in the first direction or moving in the second direction while a Coriolis force is applied to the angular rate sensor (gyroscope). This will be described below.

Figure 16:
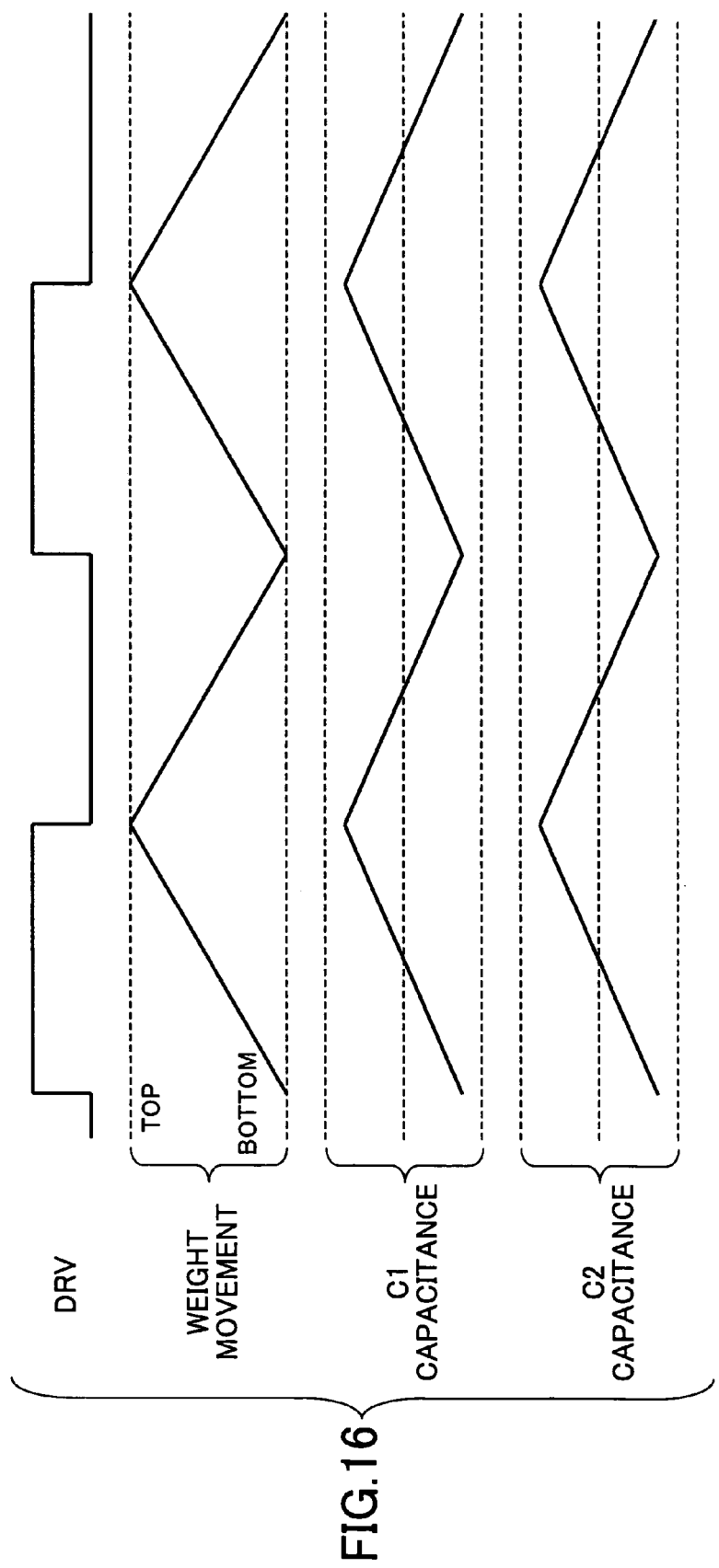
FIG. 16 is an illustrative drawing showing capacitance changes when the weight is experiencing a simple harmonic motion in the absence of angular rate.
Figure 17:
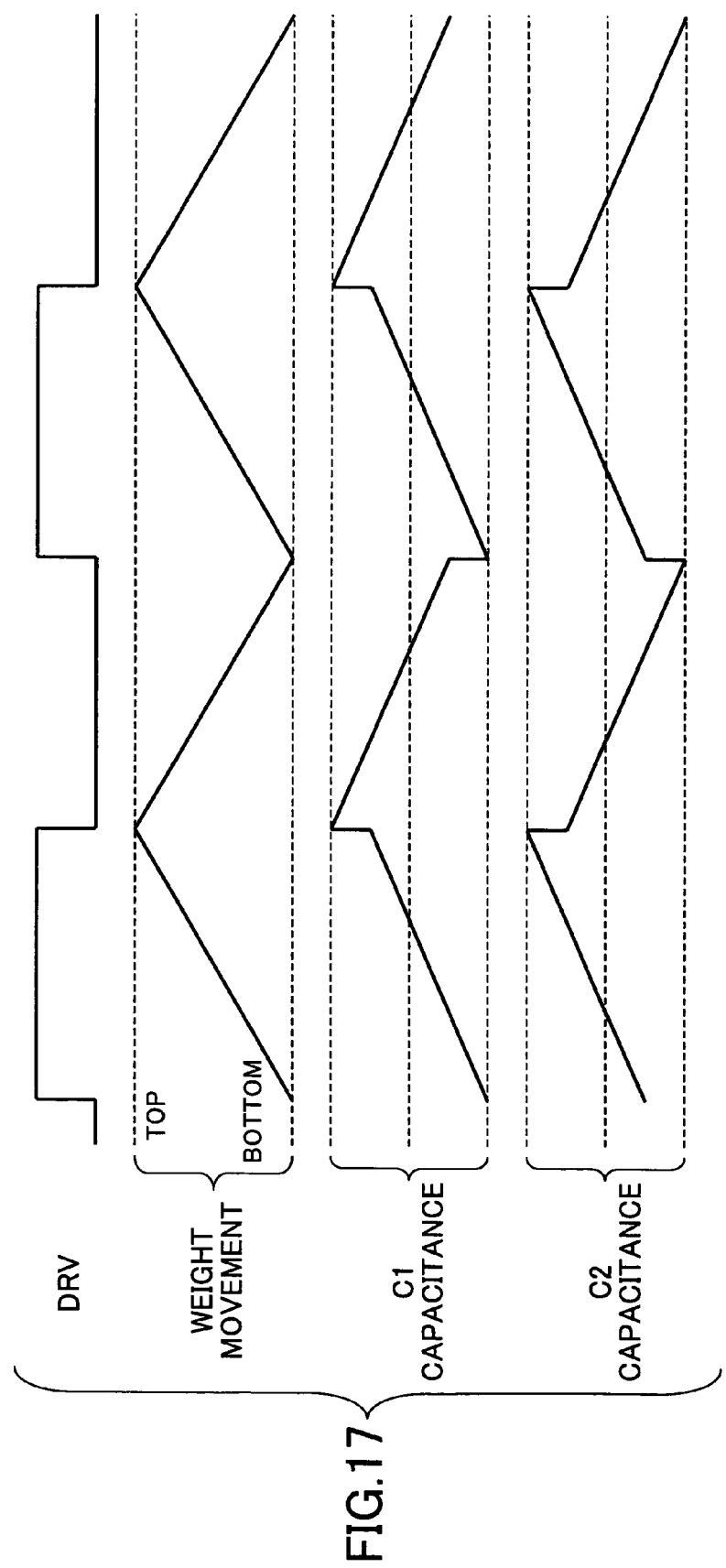
FIG. 17 is an illustrative drawing showing capacitance changes when the weight is experiencing simple harmonic motion in the presence of angular rate.

FIG. 16 is an illustrative drawing showing capacitance changes when the weight is experiencing a simple harmonic motion in the absence of angular rate. As shown in FIG. 16, the drive signal DRV is HIGH while the weight is moving in the first direction (upward movement), and is LOW while the weight is moving in the second direction (downward movement). Due to the simple harmonic motion of the weight, the capacitances of the capacitor C1 and the capacitor C2 alternate between an increasing change and a decreasing change. Since angular rate does not exist and no Coriolis force is present, the weight does not tilt, resulting in the capacitances of the capacitor C1 and the capacitor C2 being equal to each other. FIG. 17 is an illustrative drawing showing capacitance changes when the weight is experiencing simple harmonic motion in the presence of angular rate. As shown in FIG. 17, due to the simple harmonic motion of the weight, the capacitances of the capacitor C1 and the capacitor C2 alternate between an increasing change and a decreasing change. Since angular rate exists and a Coriolis force is applied, the weight tilts, resulting in the distance between the electrodes of the capacitor C1 being different from the distance between the electrodes of the capacitor C2. In the case of the weight moving in the first direction (upward movement), the capacitance of the capacitor C1 is smaller than the capacitance of the capacitor C2 whereas in the case of the weight moving in the second direction (downward movement), the capacitance of the capacitor C1 is larger than the capacitance of the capacitor C2 due to the tilting of the weight to a different side.

In this manner, the direction in which a Coriolis force is applied varies depending on whether the weight is moving in the first direction or moving in the second direction while the Coriolis force is applied to the angular rate sensor (gyroscope). This results in a reversal of the magnitude relationship between the capacitances of the capacitor C1 and the capacitor C2. In this case, although the direction of the Coriolis force changes, the direction of the angular rate stays the same. Thus, the reversal of the magnitude relationship between the capacitances does not reflect the physical quantity to be measured (i.e., angular rate). It is therefore preferable that the detection circuit is not affected by such reversal in the magnitude relationship. Further, if the voltage pulses of the signal DO output from the charge pump 54 are integrated in a straightforward manner as in the first embodiment, the HIGH pulses of the signal DO corresponding to movement in a given direction are integrated with the LOW pulses of the signal DO corresponding to movement in the opposite direction. This results in the cancellation of capacitance differences. In the second embodiment shown in FIG. 14, the switchover circuit 91 switches the signal correspondences between the signals B and C and the signals BB and CC, depending on whether the weight is moving in the first direction or moving in the second direction.

Figure 18:
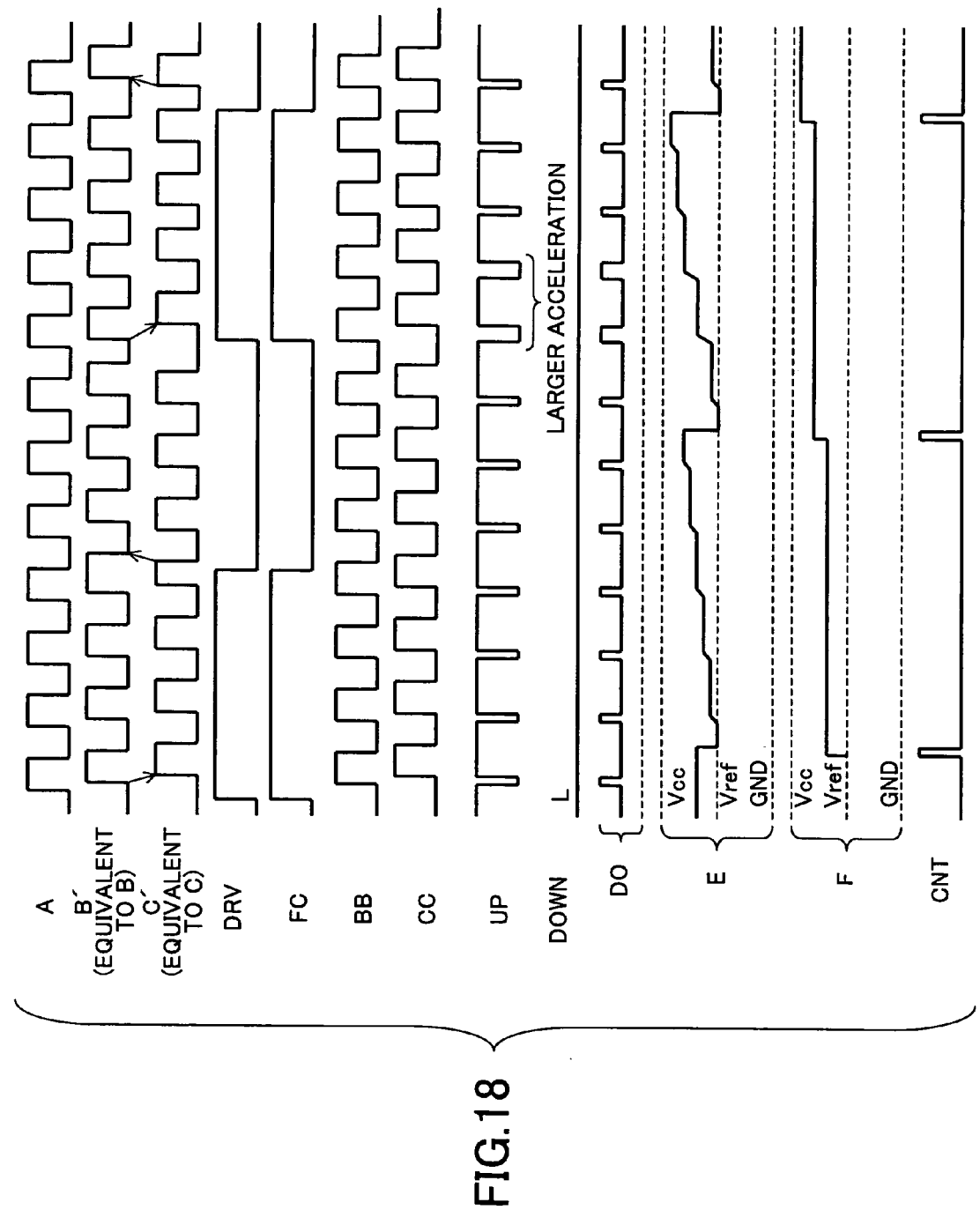
FIG. 18 is a signal waveform diagram for explaining the operation of the detection circuit of FIG. 14.

FIG. 18 is a signal waveform diagram for explaining the operation of the detection circuit of FIG. 14. Each signal shown in FIG. 18 is identified with its signal position in the circuit of FIG. 14. For the sake of convenience of explanation, signal waveforms B' and C' having cleaner shapes equivalent to the signals B and C are also illustrated.

When the oscillator 50 of FIG. 14 generates a signal A comprised of repeated pulses as shown in FIG. 18, the signals B and C output from the respective buffers 51 and 52 are delayed according to the capacitances of the respective capacitors C1 and C2. The way such a delay occurs is shown in FIG. 18 as the time differences of rising edges and falling edges between the cleaner shaped signals B' and C' equivalent to the signals B and C. When the drive signal DRV shown FIG. 18 is HIGH, which indicates movement in the first direction, the capacitance C2 is larger than the capacitance C1, so that the signal C' has a longer delay than the signal B'. When the drive signal DRV is LOW, which indicates movement in the second direction, the capacitance C1 is larger than the capacitance C2, so that the signal B' has a longer delay than the signal C'.

The switchover circuit 91 switches signal correspondences between the signals B and C and the signals BB and CC, depending on whether the timing signal FC is HIGH or LOW. When the signal BB and the signal CC shown in FIG. 18 are obtained in this manner, the signal CC always has a longer delay than the signal BB.

The phase comparator 53 compares the phases of the signal BB and the signal CC. The phase comparator 53 asserts the signal UP when the phase of the signal BB is earlier than the phase of the signal CC, and asserts the signal DOWN when the phase of the signal BB is later than the phase of the signal CC. In this example, the phase of the signal BB is earlier than the phase of the signal CC, so that the signal UP is asserted as shown in FIG. 18. It should be noted that the signal UP is a negative logic signal whereas the signal DOWN is a positive logic signal.

Subsequent operations are the same as those of the first embodiment. The charge pump 54 outputs the signal DO, which is a HIGH pulse having the same width as the signal UP. The low-pass filter 55 integrates the signal DO to generate a signal E having a voltage level responsive to the delay time difference (phase difference). The signal CNT is generated once in every five pulses of the signal A, thereby resetting the voltage changes of the signal E.

The sample-and-hold circuit 59 samples and holds the potential of the signal E each time a pulse of the signal CNT arrives, thereby outputting a signal F. In this manner, when detecting a potential responsive to a phase difference, i.e., when detecting a potential responsive to a capacitance difference, the potential responsive to the capacitance difference is integrated over the period corresponding to a predetermined number of cycles. This makes it possible to generate a signal having less noise, thereby achieving accurate detection of a capacitance difference.

Figure 19:
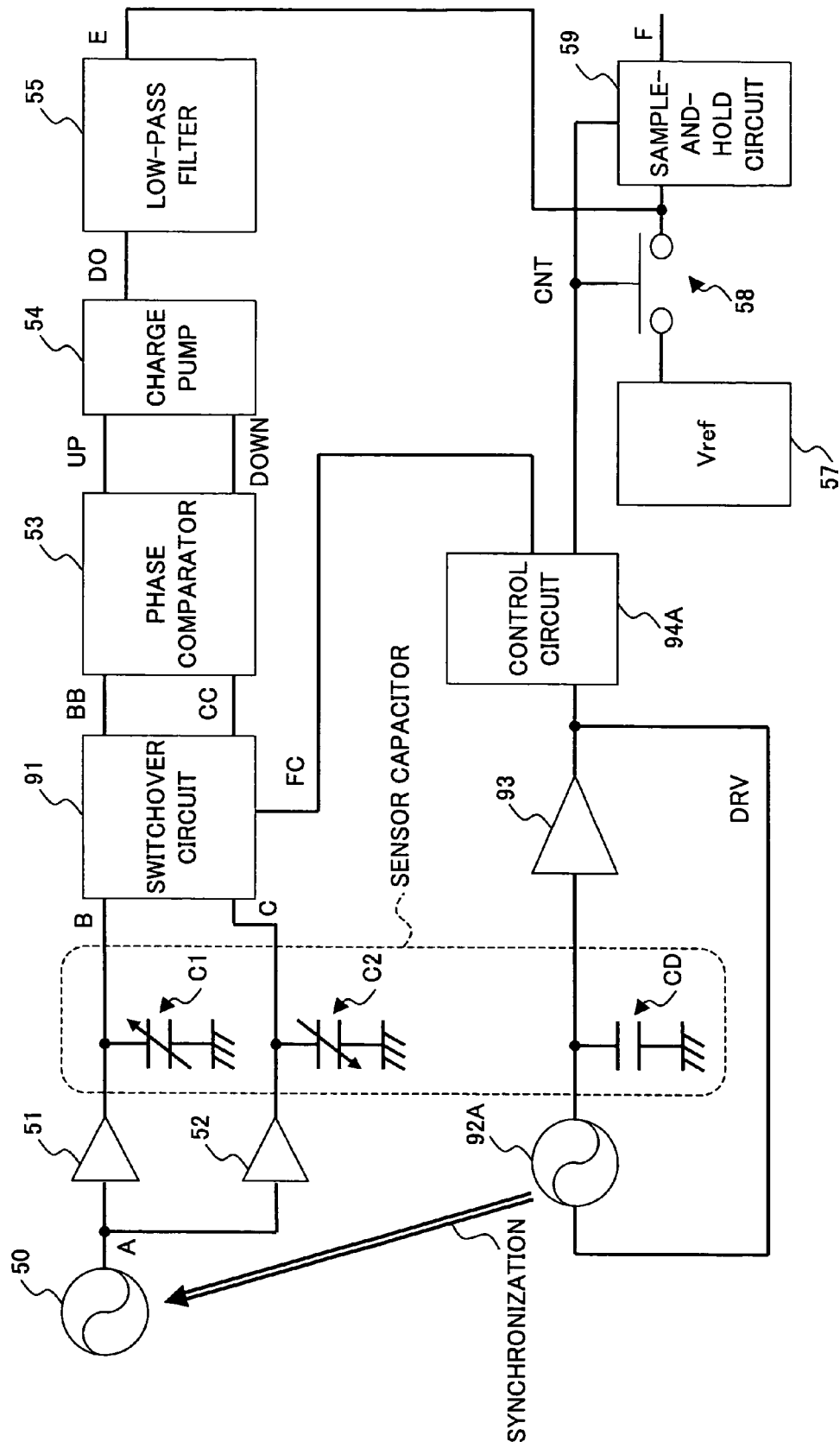
FIG. 19 is a block diagram showing an example of the construction of a third embodiment of the detection circuit according to the present invention.

FIG. 19 is a block diagram showing an example of the construction of a third embodiment of the detection circuit according to the present invention. The detection circuit of FIG. 19 is used for a sensor such as an angular rate sensor (gyroscope) that requires sensor-driven vibration. In FIG. 19, the same elements as those of FIG. 14 are referred to by the same numerals, and a description thereof will be omitted.

The detection circuit of FIG. 19 includes the oscillator 50, the buffers 51 and 52, the phase comparator 53, the charge pump 54, the low-pass filter 55, the reference voltage generating circuit (Vref) 57, the switch 58, the sample-and-hold circuit 59, the switchover circuit 91, an oscillator 92A, a buffer 93, and a control circuit 94A. In the detection circuit of the second embodiment of FIG. 14, it is assumed that no synchronization is maintained between the oscillator 92 for generating the drive signal and the oscillator 50 for generating the signal for detection. In the detection circuit of the third embodiment shown in FIG. 19, on the other hand, the oscillator 92A for generating the drive signal is in synchronization with the oscillator 50 for generating the signal for detection. In order to establish such synchronization, a PLL circuit operating on the sensor drive signal as a reference frequency signal may be provided, and a signal having frequency equal to a multiple of the frequency of the sensor drive signal may be used as the detection signal.

The control circuit 94A detects the timing of movement of the weight in a first direction (e.g., downward movement) and the timing of movement of the weight in a second direction (e.g., upward movement) based on the pulse signal DRV. A timing signal FC indicative of the detected timing is supplied to the switchover circuit 91. Based on the pulse signal DRV, the control circuit 94A further generates the signal CNT that defines the sample timing of the sample-and-hold circuit 59 and the reset timing of the output signal E of the low-pass filter 55. In the third embodiment, the pulse signal (drive signal) DRV is in synchronization with the detection signal, so that it is possible to generate the signal CNT based on the pulse signal DRV. As a result, the third embodiment has an advantage in that there is no need for the counter 56.

Figure 20:
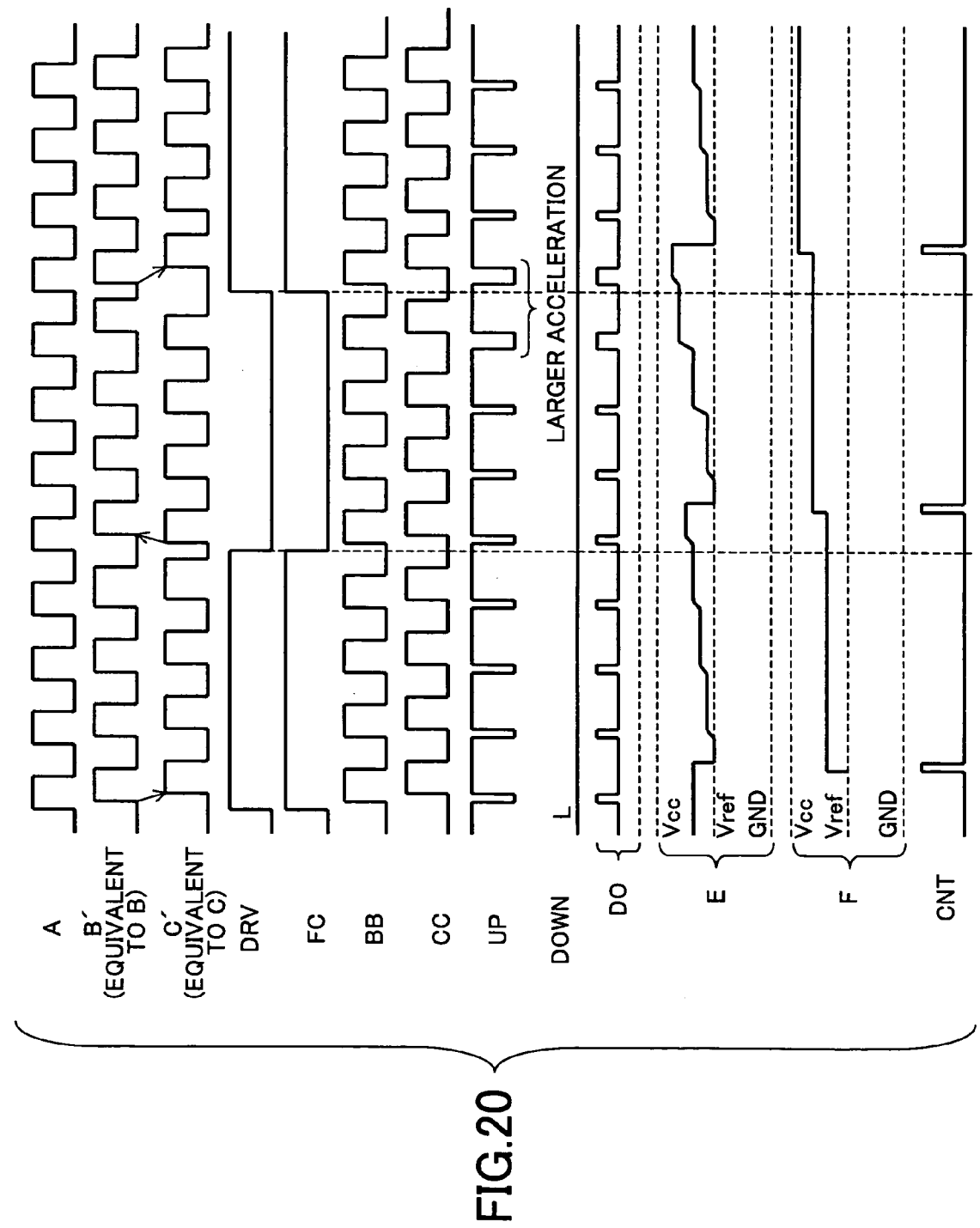
FIG. 20 is a signal waveform diagram for explaining the operation of the detection circuit of FIG. 19.

FIG. 20 is a signal waveform diagram for explaining the operation of the detection circuit of FIG. 19. Each signal shown in FIG. 20 is identified with its signal position in the circuit of FIG. 19. For the sake of convenience of explanation, signal waveforms B' and C' having cleaner shapes equivalent to the signals B and C are also illustrated.

Unlike the signal waveform indicative of the operation of the second embodiment shown in FIG. 18, the signal DRV and the signal A are synchronized with each other in the signal waveform of FIG. 20. In this example, one cycle of the signal DRV is equivalent to eight cycles of the signal A. Moreover, the signal CNT is generated with a predetermined delay time in synchronization with the rising edges and falling edges of the signal DRV. Accordingly, the sampling of the sample-and-hold circuit 59 and the resetting of the output signal E of the low-pass filter 55 are carried out once in every four cycles of the signal A. Other operations are the same as those of the second embodiment shown in FIG. 18, and a description thereof will be omitted.

Figure 21:
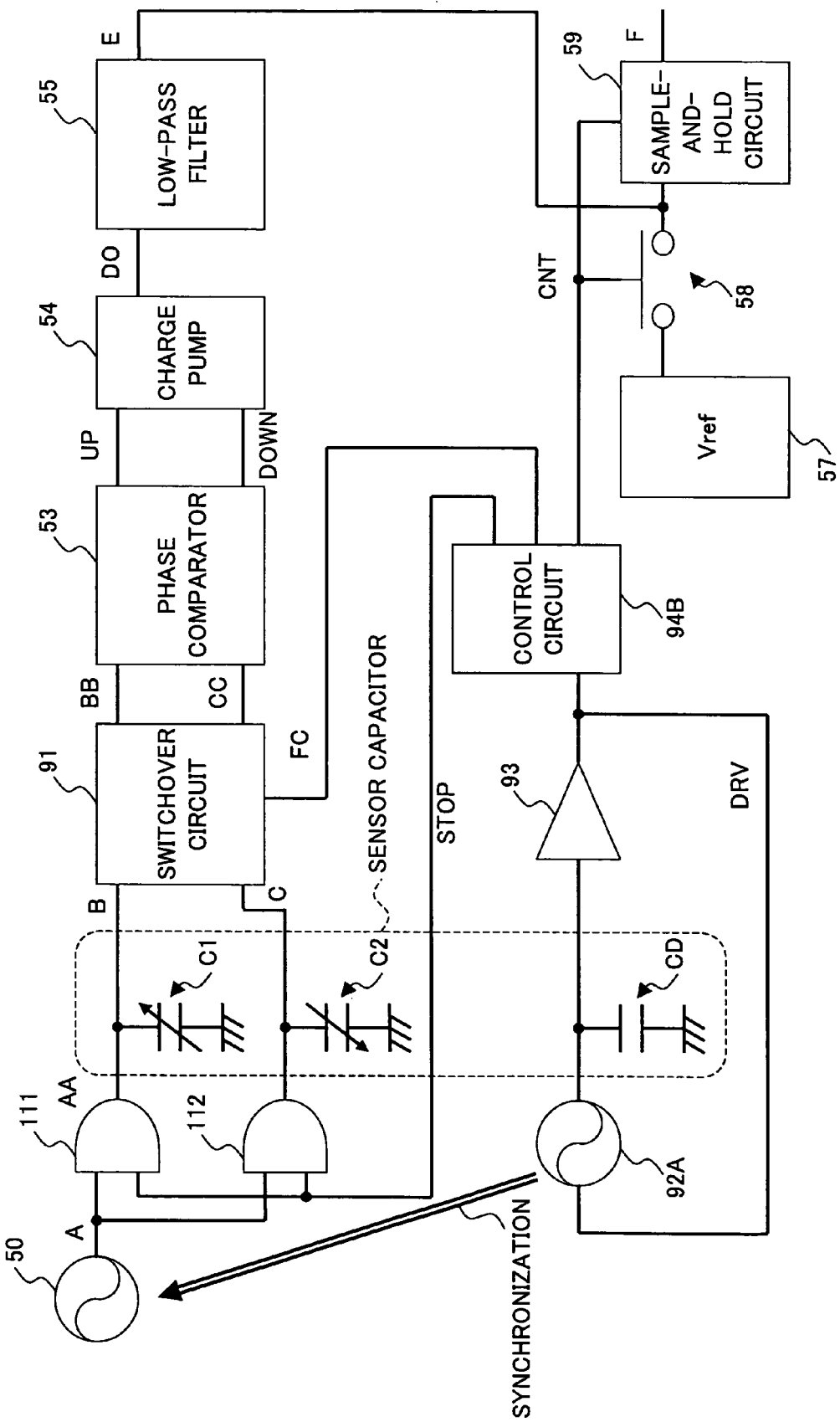
FIG. 21 is a block diagram showing an example of the construction of a fourth embodiment of the detection circuit according to the present invention.

FIG. 21 is a block diagram showing an example of the construction of a fourth embodiment of the detection circuit according to the present invention. The detection circuit of FIG. 21 is used for a sensor such as an angular rate sensor (gyroscope) that requires sensor-driven vibration. In FIG. 21, the same elements as those of FIG. 19 are referred to by the same numerals, and a description thereof will be omitted.

The detection circuit of FIG. 21 includes the oscillator 50, AND circuits 111 and 112, the phase comparator 53, the charge pump 54, the low-pass filter 55, the reference voltage generating circuit (Vref) 57, the switch 58, the sample-and-hold circuit 59, the switchover circuit 91, the oscillator 92A, the buffer 93, and a control circuit 94B. In the detection circuit of FIG. 21, the AND circuits 111 and 112 are provided in place of the buffers 51 and 52 that are included in the detection circuit of FIG. 19. The AND circuits 111 and 112 serve to suspend the supply of the signal A when a stop signal STOP supplied from the control circuit 94B is set to LOW. The control circuit 94B generates this stop signal STOP in response to the drive signal DRV.

The suspension of supply of the signal A in response to the stop signal STOP is intended to stop the detection of capacitances at the timing at which the direction of movement of the weight reverses from the first direction to the second direction. When the direction of movement of the weight reverses, the tilting angle of the weight does not reflect the angular rate, resulting in the unstable angle and speed of the weight. This prevents the accurate detection of angular rate.

Figure 22:
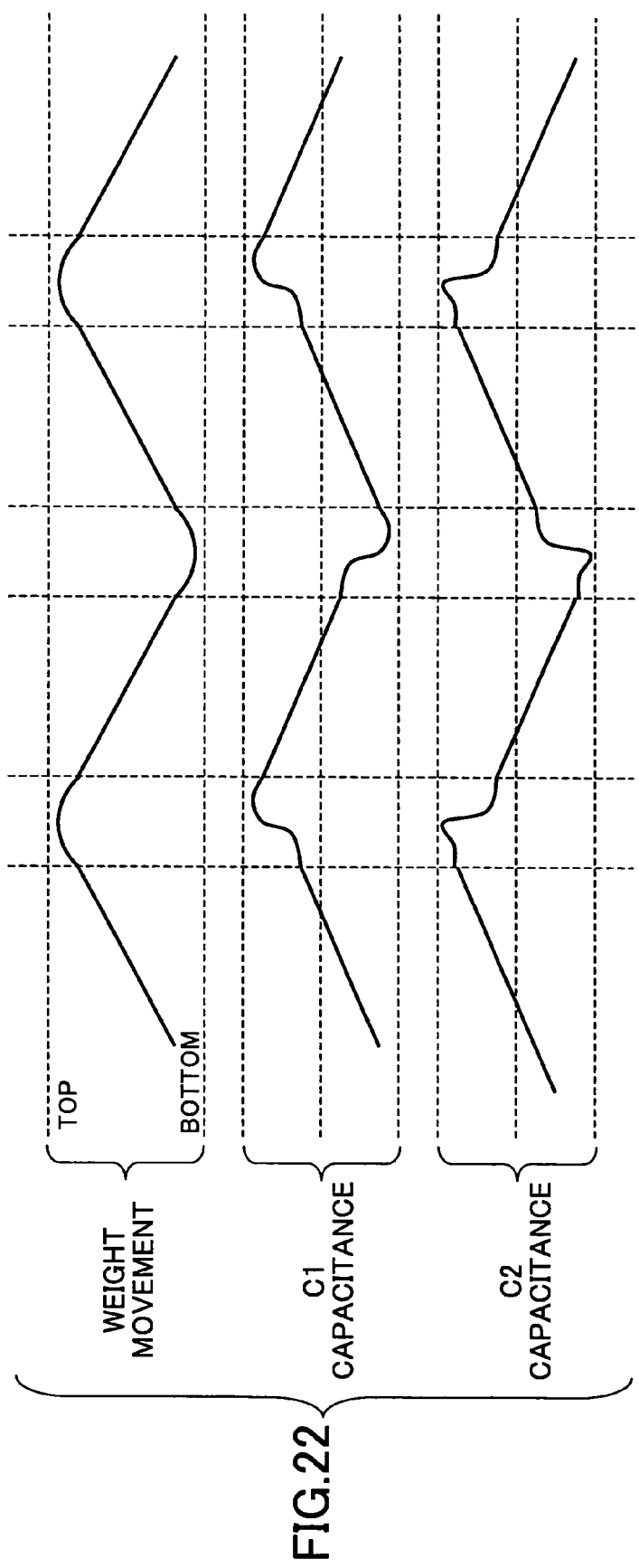
FIG. 22 is an illustrative drawing for explaining the loss of stability of capacitances at the time of reversal of the direction of weight movement.

FIG. 22 is an illustrative drawing for explaining the loss of stability of capacitances at the time of reversal of the direction of weight movement. When the weight is experiencing simple harmonic motion, capacitances ideally change instantly at the timing at which the direction of weight movement reverses. In reality, however, as shown in FIG. 22, the motion of the weight becomes irregular, resulting also in the irregular changes of capacitances. As a result, the changes of capacitances do not correspond to the angular rate that is being applied.

In the fourth embodiment shown in FIG. 21, the supply of the signal A is suspended in response to the stop signal STOP, thereby stopping the detection of capacitances during a predetermined time period before and after the instance at which the movement of the weight reverses its direction. This can eliminate influence of noises caused by irregular movement.

Figure 23:
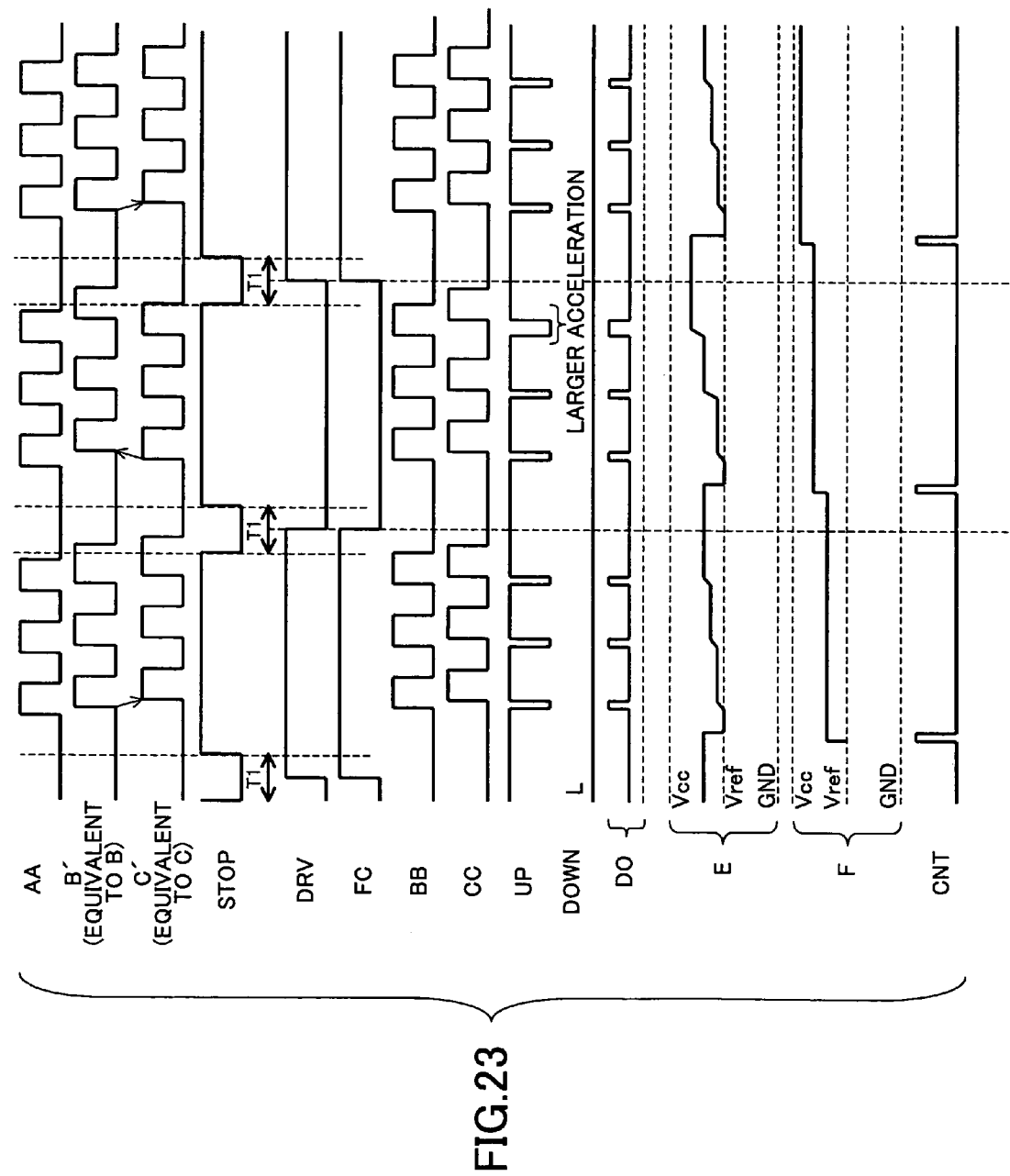
FIG. 23 is a signal waveform diagram for explaining the operation of the detection circuit of FIG. 21.

FIG. 23 is a signal waveform diagram for explaining the operation of the detection circuit of FIG. 21. Each signal shown in FIG. 23 is identified with its signal position in the circuit of FIG. 21. For the sake of convenience of explanation, signal waveforms B' and C' having cleaner shapes equivalent to the signals B and C are also illustrated.

In FIG. 23, the output signal AA of the AND circuits 111 and 112 is shown at the top. With respect to the signal AA, the supply of pulses is stopped during the period T1 during which the stop signal STOP is LOW. To be specific, the signal AA is obtained by performing an AND operation between the signal A and the stop signal STOP. Since the signal AA is suspended during a time period around the timing of a reversal of weight movement, the signals BB, CC, UP, DOWN, and DO generated based on the signal AA are not generated around the timing of a reversal of weight movement. Other operations are the same as those of the third embodiment shown in FIG. 20, and a description thereof will be omitted.

Figure 24:
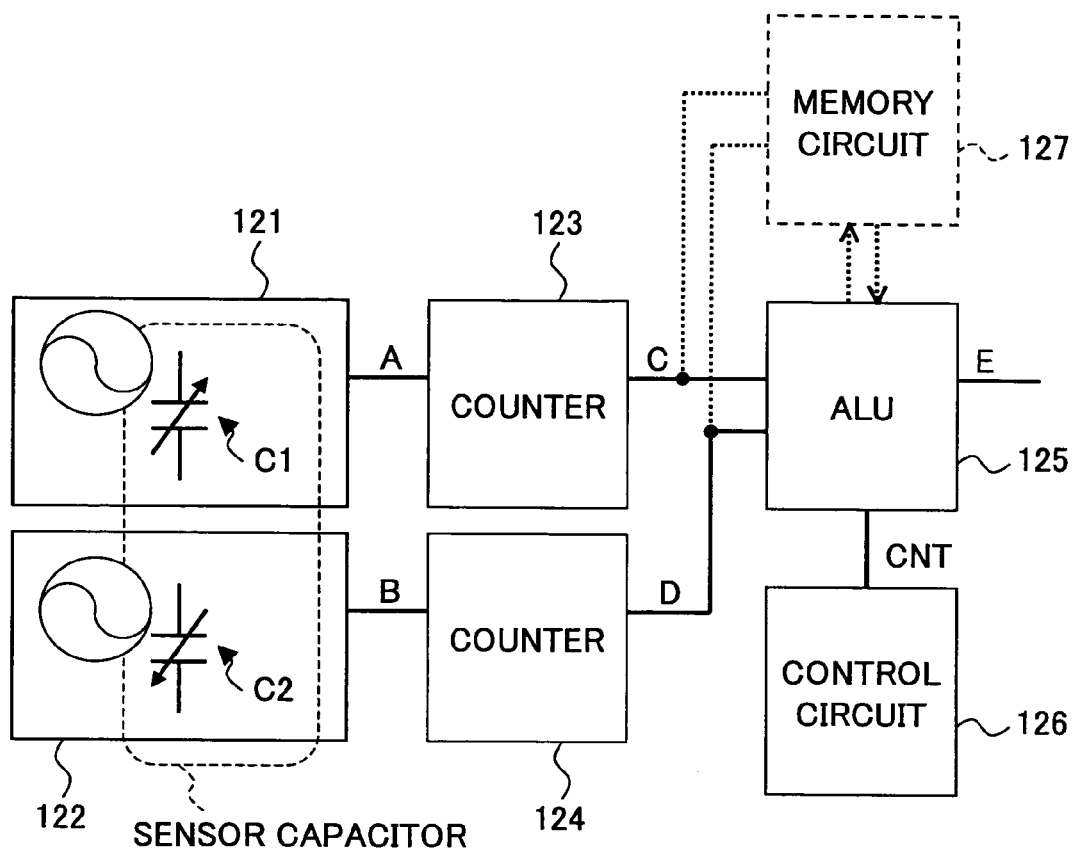
FIG. 24 is a block diagram showing an example of the construction of a fifth embodiment of the detection circuit according to the present invention.

FIG. 24 is a block diagram showing an example of the construction of a fifth embodiment of the detection circuit according to the present invention. The detection circuit of FIG. 24 serves to detect a minute capacitance difference in a sensor such as a pressure sensor or an acceleration sensor that requires no sensor-driven vibration.

The detection circuit of FIG. 24 includes oscillation circuits 121 and 122, counters 123 and 124, an ALU (arithmetic logic operation circuit) 125, and a control circuit 126. The detection circuit may further include a memory circuit 127 according to need.

Figure 25:
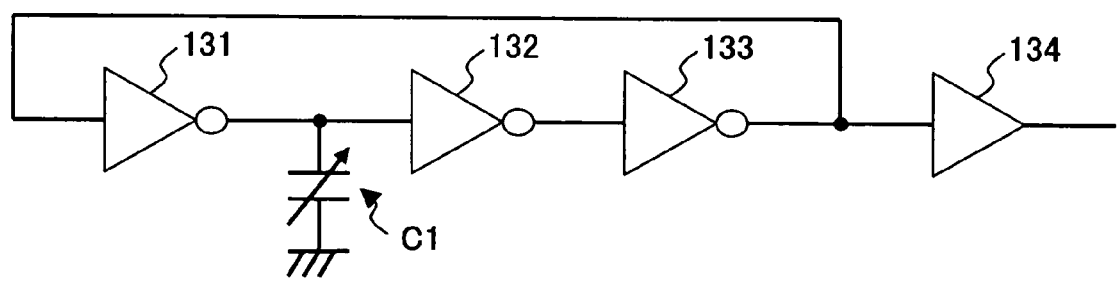
FIG. 25 is a circuit diagram showing an example of the circuit construction of an oscillation circuit.

The oscillation circuits 121 and 122 include sensor capacitors C1 and C2, respectively, and oscillate with respective frequencies responsive to the capacitances of these capacitors. FIG. 25 is a circuit diagram showing an example of the circuit construction of the oscillation circuit 121. The oscillation circuit 122 can also be implemented by using the same circuit construction. The oscillation circuit of FIG. 25 includes inverters 131 through 133, a buffer 134, and a capacitor C1. The inverters 131 through 133 constitute a ring oscillator, which oscillates with a predetermined frequency responsive to the capacitor C1. The oscillation signal is supplied to a subsequent stage through the buffer 134.

The oscillation signals A and B generated by the oscillation circuits 121 and 122 are supplied to the counters 123 and 124, respectively. The counters 123 and 124 count the pulses of the respective oscillation signals A and B, and supply respective counts C and D to the ALU 125. The ALU 125 performs predetermined computation based on the two counts C and D, thereby to obtain a capacitance difference between the capacitor C1 and the capacitor C2. The ALU 125 responds to the signal CNT periodically supplied from the control circuit 126 at predetermined intervals by performing the above-noted computation.

For example, a difference may be computed between the count C of the oscillation signal A responsive to the capacitance of the capacitor C1 and the count D of the oscillation signal B responsive to the capacitance of the capacitor C2, thereby obtaining a capacitance difference. Further, averaging, filtering, etc., may be carried out as circumstances may require, thereby removing noise components to obtain a capacitance difference with high accuracy. Moreover, the memory circuit 127 may be provided to store a reference oscillation frequency. With this provision, it is possible to achieve highly accurate measurement through correctional computation that removes noise factors even if the oscillation frequency changes due to the noise factors such as manufacturing variation, temperature fluctuation, power-supply-voltage fluctuation, etc.

Figure 26:
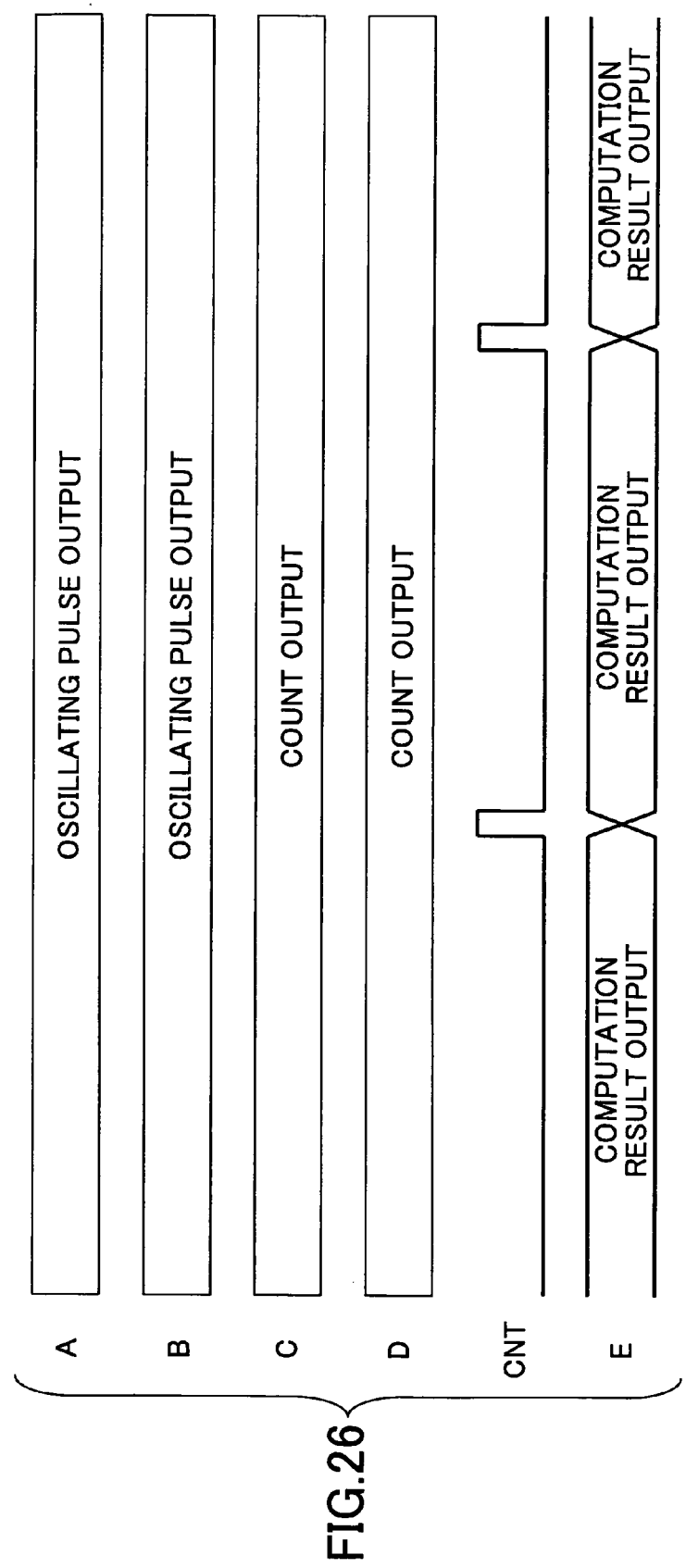
FIG. 26 is a diagram for explaining the computation timing of an ALU.

FIG. 26 is a diagram for explaining the computation timing of the ALU 125. As shown in FIG. 26, the oscillation signals A and B are constantly supplied, and the counts C and D constantly reflect the numbers of pulses of the respective oscillation signals A and B. As shown in FIG. 26, the signal CNT is periodically supplied from the control circuit 126 at predetermined intervals. In response to the signal CNT, the ALU 125 performs predetermined computation to output the computation results.

The detection circuit of the fifth embodiment is provided with an integrating effect (averaging effect) brought about by the integration of capacitances over the time period corresponding to the interval of the signal CNT, thereby achieving highly accurate measurement. Moreover, since measurement is based on digital computation, it is less susceptible to noise and circuit characteristics, compared with measurement based on analog values such as a voltage level as in the previous embodiments. Further, measurement based on digital computation allows error correction to be easily performed.

Figure 27:
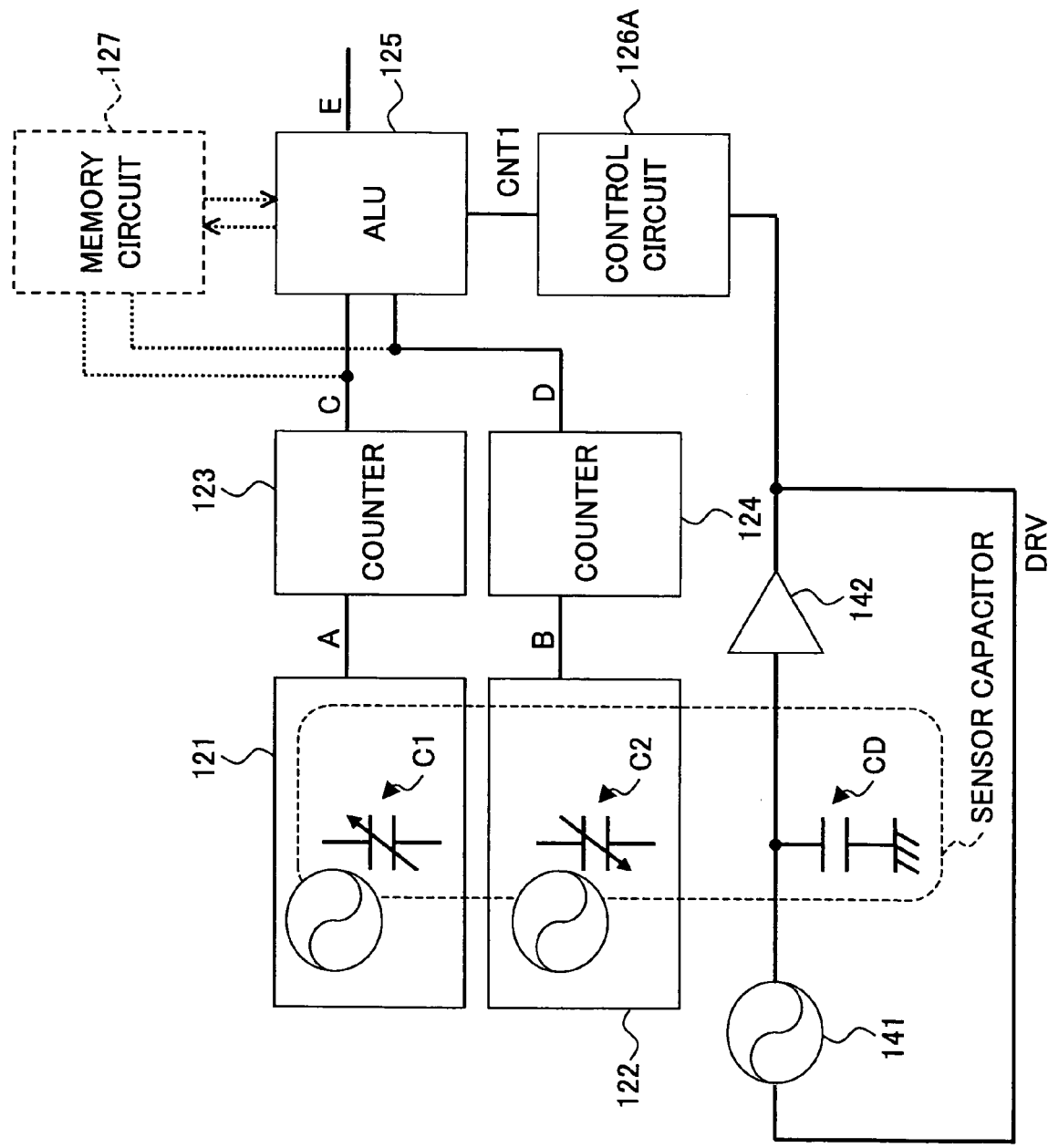
FIG. 27 is a block diagram showing an example of the construction of a sixth embodiment of the detection circuit according to the present invention.

FIG. 27 is a block diagram showing an example of the construction of a sixth embodiment of the detection circuit according to the present invention. The detection circuit of FIG. 27 is used for a sensor such as an angular rate sensor (gyroscope) that requires sensor-driven vibration. In FIG. 27, the same elements as those of FIG. 24 are referred to by the same numerals, and a description thereof will be omitted.

The detection circuit of FIG. 27 includes the oscillation circuits 121 and 122, the counters 123 and 124, the ALU (arithmetic logic operation circuit) 125, a control circuit 126A, an oscillator 141, and a buffer 142. The detection circuit may further include the memory circuit 127 according to need. The oscillator 141 generates an alternating voltage as a drive signal. This drive signal may be a rectangular waveform, or may be a sinusoidal waveform, for example. The drive signal is applied to a drive capacitor CD of the angular rate sensor (gyroscope), thereby causing simple harmonic motion of a weight (34 in FIG. 5) of the angular rate sensor (gyroscope) in the vertical direction. The buffer 142 receives the drive signal, and generates a cyclic pulse signal DRV responsive to the drive signal. The control circuit 126A detects the timing of movement of the weight in a first direction (e.g., upward movement) and the timing of movement of the weight in a second direction (e.g., downward movement) based on the pulse signal DRV. A timing signal CNT1 indicative of the detected timing is supplied to the ALU 125. Based on the timing signal CNT1, the ALU 125 determines whether the weight is moving in the first direction or moving in the second direction, thereby attending to data processing to ensure that the direction of the measured angular rate does not reverse even when the direction of the Coriolis force reverses.

Figure 28:
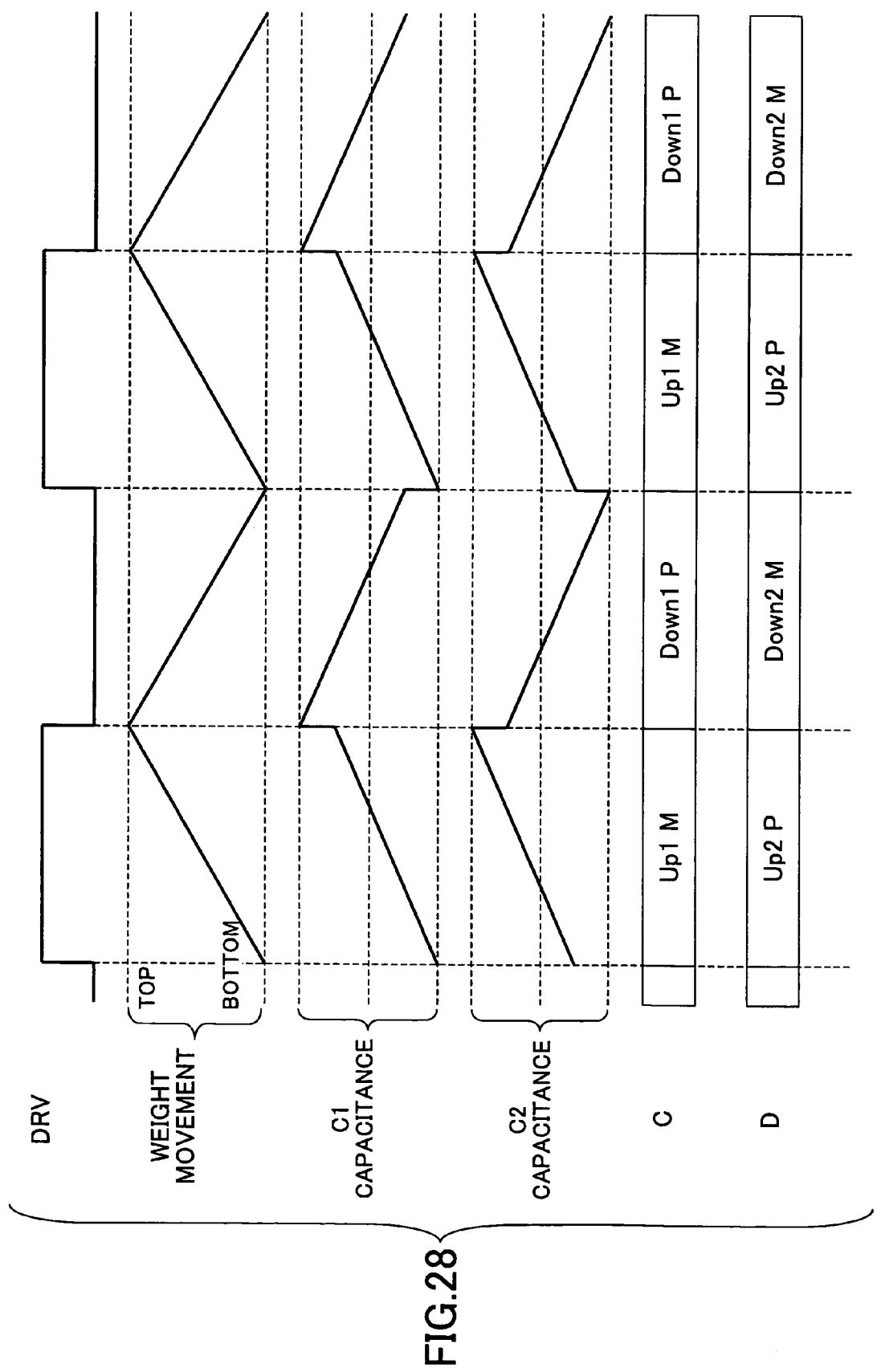
FIG. 28 is an illustrative drawing for explaining computation performed by the ALU.

FIG. 28 is an illustrative drawing for explaining computation performed by the ALU 125. In FIG. 28, the drive signal DRV is HIGH while the weight is moving in the first direction (upward movement), and is LOW while the weight is moving in the second direction (downward movement). Due to the simple harmonic motion of the weight, the capacitances of the capacitor C1 and the capacitor C2 alternate between an increasing change and a decreasing change. Since angular rate exists and a Coriolis force is applied, the weight tilts, resulting in the distance between the electrodes of the capacitor C1 being different from the distance between the electrodes of the capacitor C2. In the case of the weight moving in the first direction (upward movement), the capacitance of the capacitor C1 is smaller than the capacitance of the capacitor C2 whereas in the case of the weight moving in the second direction (downward movement), the capacitance of the capacitor C1 is larger than the capacitance of the capacitor C2 due to the tilting of the weight to a different side. For the sake of explanation of a computation process, the period corresponding to the movement of the weight in the first direction and the period corresponding to the movement of the weight in the second direction are denoted as Up1 and Down1, respectively, with respect to the count C. With respect to the count D, further, the period corresponding to the movement of the weight in the first direction and the period corresponding to the movement of the weight in the second direction are denoted as Up2 and Down2, respectively. Being suffixed to these notations, P represents the side with the larger capacitance, and M represents the side with the smaller capacitance, in connection with the magnitude relationship between the capacitance C1 and the capacitance C2.

The size of the angular rate is a difference in oscillation frequency caused by a difference in capacitance. Because of this, the count indicated by P minus the count indicated by M in FIG. 28 gives a value proportional to the angular rate to be measured. When a difference arises in oscillation frequency between the oscillation circuit 121 and the oscillation circuit 122 due to manufacturing variation or the like, such a simplistic subtraction will produce an error in the angular rate responsive to the difference in oscillation frequency caused by the manufacturing variation or the like. Accordingly, there is a need to correct this error during the computation process.

When attention is focused on one cycle of motion of the weight, the weight always returns to its original position after one cycle regardless of whether a Coriolis force is present. If a Coriolis force does not exist, the numbers of oscillating pulses are the same between the period of movement in the first direction and the period of movement in the second direction, despite the fact that the capacitances change as the weight moves. If there is a constant Coriolis force, the Coriolis force is the same magnitude but directed in the opposite directions between the period of movement in the first direction and the period of movement in the second direction, so that changes in pulse number that are the same size and opposite signs are added to the pulse count that is observed in the absence of a Coriolis force.

In the following, the number of oscillating pulses in the absence of a Coriolis force is denoted as PN, and a change in the number of oscillating pulses caused by a Coriolis force is denoted as $\Delta CP$. In this case, the pulse count PN during the period of movement in the first direction and the pulse count PN during the period of movement in the second direction are the same. Further, the pulse count change $\Delta CP$ during the period of movement in the first direction and the pulse count change $\Delta CP$ during the period of movement in the second direction are the same size with opposite signs. When the number of pulses is represented in this manner with respect to each period shown in FIG. 28, Up1_M: $PN1 - \Delta CP1$ Down1_P: $PN1 + \Delta CP1$ Up2$_{13}$ P: $PN2 + \Delta CP2$ Down2_M: $PN2 - \Delta CP2$ are obtained.

In these expressions, the direction in which capacitance increases is denoted as "+", and the direction in which capacitance decreases is denoted as "−". When the oscillation circuit as shown in FIG. 25 is used, the oscillating frequency lowers as the capacitance increases. This brings about the value of $\Delta CP$ that is negative (i.e., the frequency is lower than the frequency associated with the absence of a Coriolis force).

Here, in one cycle of weight motion, a total count during the periods Up1_M and Down2_M corresponding to the side where capacitance is smaller is subtracted from a total count during the periods Up2_P and Down1_P corresponding to the side where capacitance is larger. This produces a value as follows.

$$(PN2+\Delta CP2+PN1+\Delta CP1)-(PN1-\Delta CP1+PN2-\Delta CP2)$$
$$=(PN1+PN2+\Delta CP1+\Delta CP2)-(PN1+PN2-\Delta CP1-\Delta CP2)=2(\Delta CP1+\Delta CP2)$$

With this computation, it is possible to extract a change in the oscillating pulse count caused by a Coriolis force by canceling the respective oscillating pulse counts PN1 and PN2 of the oscillation circuits 121 and 122. Accordingly, even when a difference arises in the oscillating frequency between the oscillation circuit 121 and the oscillation circuit 122 due to manufacturing variation or the like, an error caused by such manufacturing variation or the like can be removed through simple computation.

Moreover, the memory circuit 127 may be provided to store a reference oscillation frequency. With this provision, it is possible to achieve highly accurate measurement through correctional computation that removes noise factors even if the oscillation frequency changes due to the noise factors such as manufacturing variation, temperature fluctuation, power-supply-voltage fluctuation, etc. Further, provision may be made to stop pulse counts at the timing of a change in the direction of weight movement as in the detection circuit of the fourth embodiment shown in FIG. 21, thereby further improving accuracy.

Figure 29:
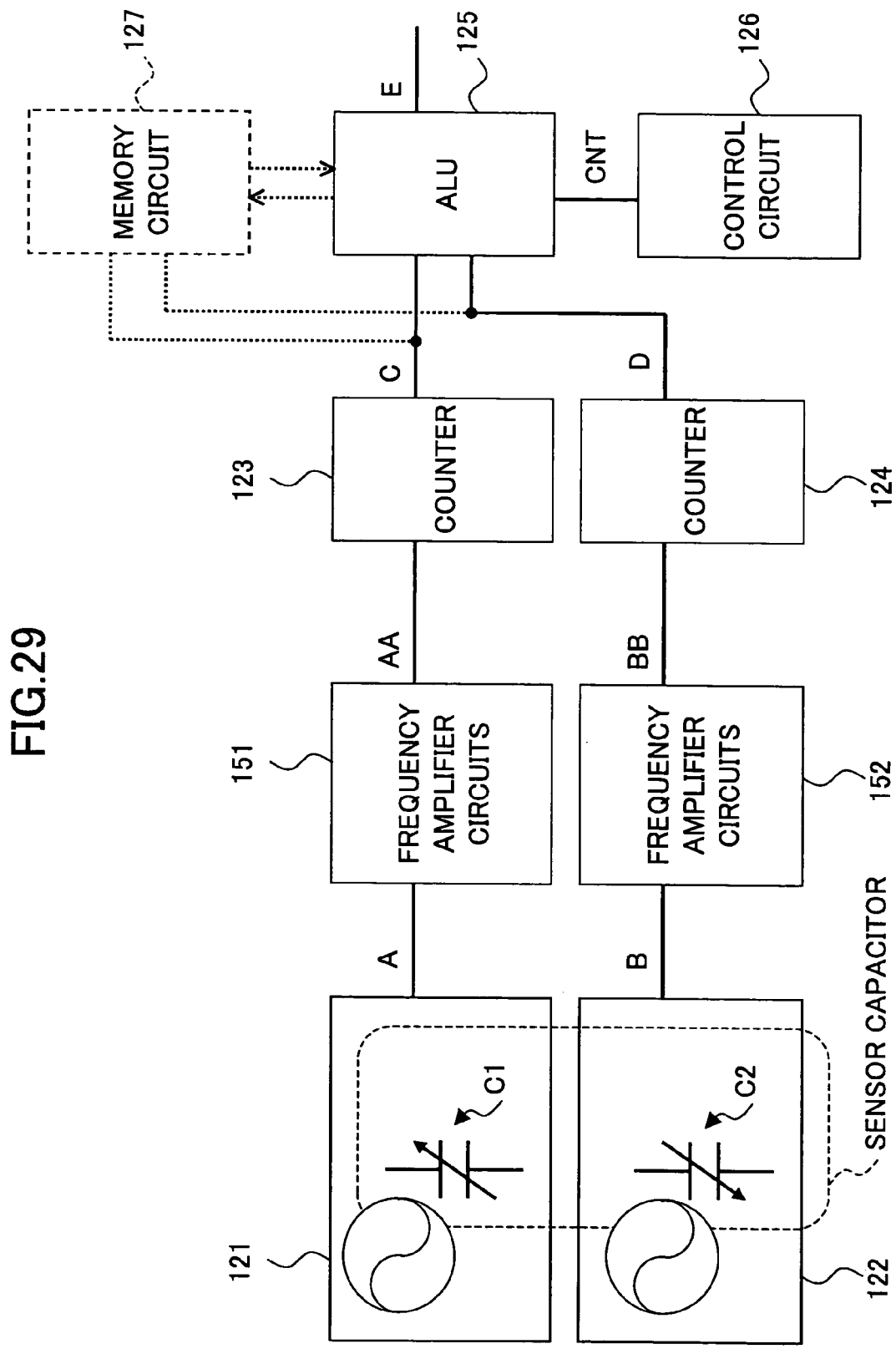
FIG. 29 is a block diagram showing an example of the construction of a seventh embodiment of the detection circuit according to the present invention.

FIG. 29 is a block diagram showing an example of the construction of a seventh embodiment of the detection circuit according to the present invention. The detection circuit of FIG. 29 serves to detect a minute capacitance difference in a sensor such as a pressure sensor or an acceleration sensor that requires no sensor-driven vibration. In FIG. 29, the same elements as those of FIG. 24 are referred to by the same numerals, and a description thereof will be omitted.

The detection circuit of FIG. 29 includes the oscillation circuits 121 and 122, the counters 123 and 124, the ALU (arithmetic logic operation circuit) 125, the control circuit 126, and frequency amplifier circuits 151 and 152. The detection circuit may further include the memory circuit 127 according to need.

The oscillation circuits 121 and 122 include the sensor capacitors C1 and C2, respectively, and oscillate with respective frequencies responsive to the capacitances of these capacitors. The oscillating pulse signals A and B are supplied to the respective frequency amplifier circuits 151 and 152, by which the frequencies of these signals are multiplied. Pulse signals AA and BB having the multiplied frequencies are supplied to the respective counters 123 and 124, by which the numbers of pulses of these signals are counted. Subsequent operations are the same as those of the fifth embodiment shown in FIG. 24.

The detection circuit of the fifth embodiment shown in FIG. 24 detects a change in the frequency of oscillating signals generated by the oscillation circuits, 121 and 122 including the sensor capacitors, thereby detecting a change in capacitance. When a change in capacitance is minute, however, a change in frequency is also minute, which may present a problem in that sufficient accuracy may not be achieved. In the seventh embodiment shown in FIG. 29, the frequency amplifier circuits 151 and 152 amplify changes in frequency, thereby making it possible to measure a change in capacitance accurately.

PLL (Phase Locked Loop) circuits may be used as the frequency amplifier circuits 151 and 152. A PLL circuit is generally implemented by including a frequency divider, a phase comparator, a charge pump, a low-pass filter, and a VCO (voltage controlled oscillator). The oscillating frequency of the VCO is divided into 1/N by the frequency divider. The phase comparator compares phases between the frequency-divided signal and a reference signal. The phase comparison results control the output voltage of the charge pump. The output voltage of the charge pump is then supplied to the VCO through the low-pass filter. This feedback control adjusts the oscillating frequency of the VCO such that the phase comparison by the phase comparator indicates a zero phase difference. This makes it possible to generate an oscillating signal having its phase locked to the reference frequency and also to generate a signal having frequency equal to a multiple (N times) of the reference frequency.

When PLL circuits are to be used as the frequency amplifier circuits 151 and 152, the oscillation signals A and B supplied from the respective oscillation circuits 121 and 122 may be used as reference signals, so that the signals having frequencies equal to multiples of the frequencies of the reference signals are generated as the output signals BB and CC. In so doing, with the frequency of the oscillation signals A and B being denoted as f, and a change in the frequency in response to a capacitance change being denoted as $\Delta f$, the cutoff frequencies of the low-pass filters of the PLL circuits are set higher than or equal to $\Delta f$ and lower than or equal to f. With this provision, the frequency change $\Delta f$ is not absorbed by the PLL circuits, and the multiplied (N times) frequencies output from the PLL circuits are changed by $N\Delta f$ in response to the frequency change $\Delta f$.

Figure 30:
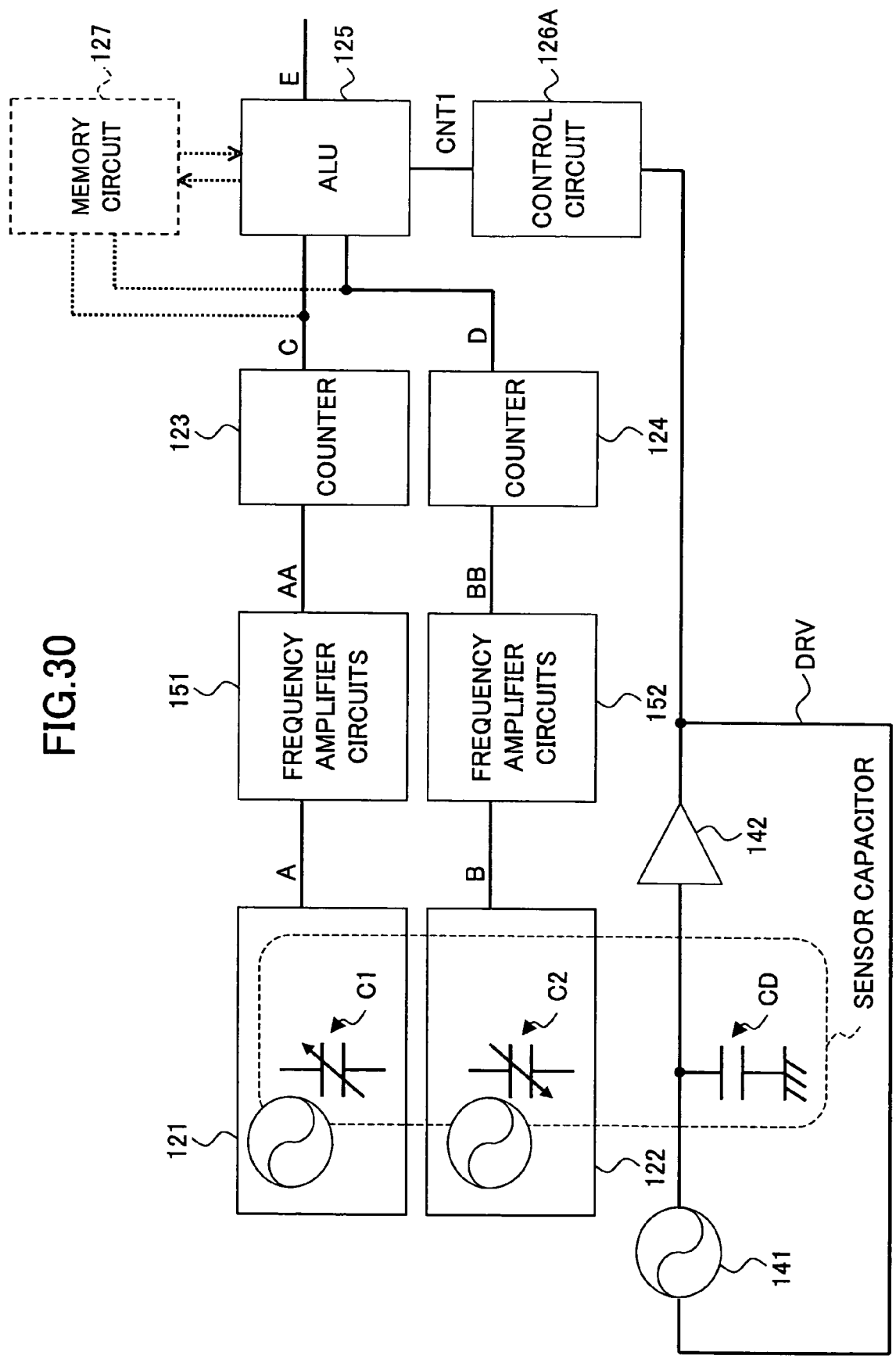
FIG. 30 is a block diagram showing an example of the construction of an eighth embodiment of the detection circuit according to the present invention.

FIG. 30 is a block diagram showing an example of the construction of an eighth embodiment of the detection circuit according to the present invention. The detection circuit of FIG. 30 is used for a sensor such as an angular rate sensor (gyroscope) that requires sensor-driven vibration. In FIG. 30, the same elements as those of FIG. 27 and FIG. 29 are referred to by the same numerals, and a description thereof will be omitted.

The detection circuit of FIG. 30 includes the oscillation circuits 121 and 122, the counters 123 and 124, the ALU (arithmetic logic operation circuit) 125, the control circuit 126A, the oscillator 141, the buffer 142, and the frequency amplifier circuits 151 and 152. The detection circuit may further include the memory circuit 127 according to need. In the detection circuit of the eighth embodiment shown in FIG. 30, the frequency amplifier circuits 151 and 152 are used in the same manner as in the previous embodiment to multiply the frequencies of the oscillating pulse signals to be counted, thereby achieving accurate detection of a capacitance difference.

Figure 31:
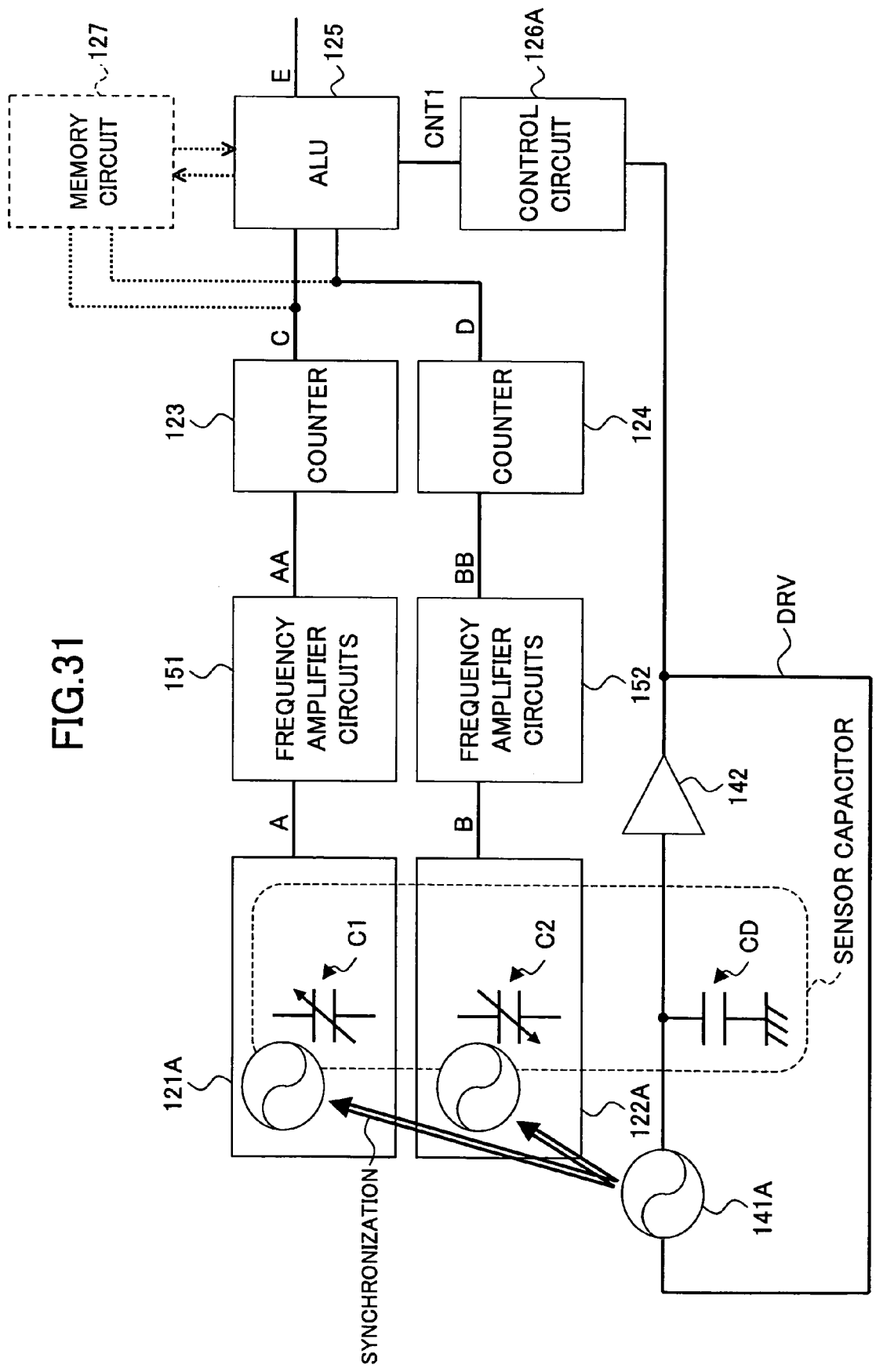
FIG. 31 is a block diagram showing an example of the construction of a ninth embodiment of the detection circuit according to the present invention.

FIG. 31 is a block diagram showing an example of the construction of a ninth embodiment of the detection circuit according to the present invention. The detection circuit of FIG. 31 is used for a sensor such as an angular rate sensor (gyroscope) that requires sensor-driven vibration. In FIG. 31, the same elements as those of FIG. 27 and FIG. 29 are referred to by the same numerals, and a description thereof will be omitted.

The detection circuit of FIG. 31 includes oscillation circuits 121A and 122A, the counters 123 and 124, the ALU (arithmetic logic operation circuit) 125, the control circuit 126A, an oscillator 141A, the buffer 142, and the frequency amplifier circuits 151 and 152. The detection circuit may further include the memory circuit 127 according to need. In the detection circuit of the eighth embodiment shown in FIG. 30, synchronization is not provided between the oscillator 141 for generating the drive signal and the oscillation circuits 121 and 122 for generating the signals for detection. In the detection circuit of the ninth embodiment shown in FIG. 31, on the other hand, the oscillator 141A for generating the drive signal is in synchronization with the oscillation circuits 121A and 122A for generating the signals for detection. Necessity of such a construction will be described in the following.

When a ring oscillator as shown in FIG. 25 is used as the oscillation circuits 121A and 122A, computation by the ALU 125 as described in the previous embodiments may not be able to remove an offset drift component sufficiently. This is because the frequency stability of the ring oscillator is low, so that oscillating signal may include jitters caused by minute external disturbance or noise in temperature, power-supply voltage, etc., or may have its frequency fluctuating in a sensitive manner. In this embodiment, thus, provision is made such that the oscillation of the oscillation circuits 121A and 122A is synchronized with the oscillation signal of the oscillator 141A. If fully locked synchronization is established, however, a frequency change responsive to a capacitance change in the capacitor C1 and the capacitor C2 cannot be extracted. In consideration of this, provision needs to be made such that a frequency f is synchronized whereas a frequency change Δf is allowed to make unrestricted changes where the oscillation frequency of the oscillation circuits 121A and 122A is represented as f+Δf (Δf: frequency change responsive to a capacitance change)

Figure 32:
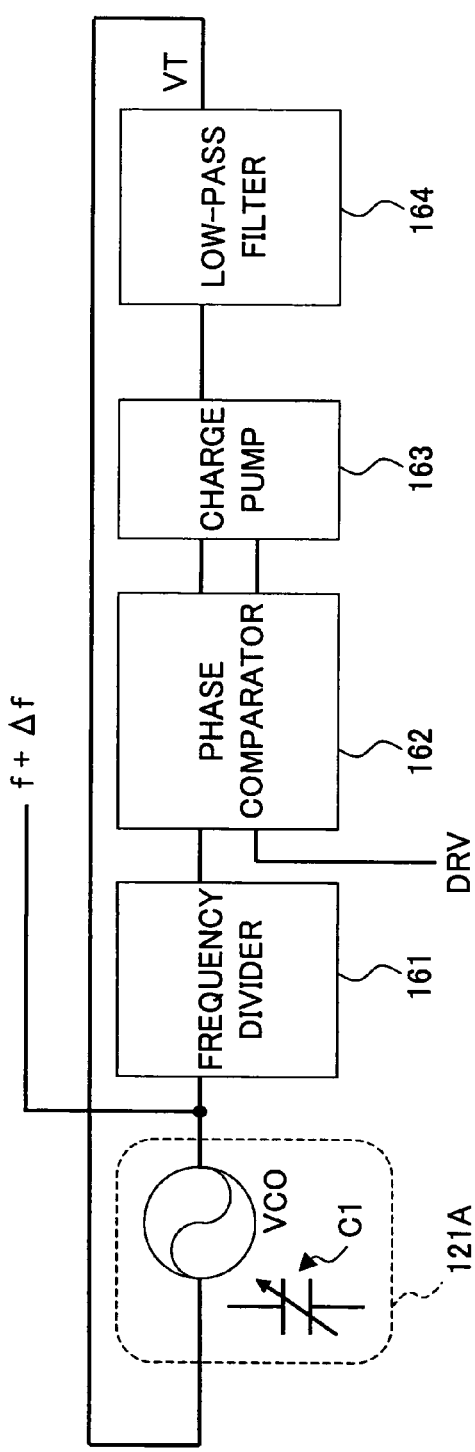
FIG. 32 is a circuit diagram showing an example of the construction of a circuit that synchronizes a drive signal with an oscillation circuit for generating a detection signal.

FIG. 32 is a circuit diagram showing an example of the construction of a circuit that synchronizes the drive signal with the oscillation circuit for generating the detection signal. The circuit of FIG. 32 is a PLL circuit, and includes a frequency divider 161, a phase comparator 162, a charge pump 163, a low-pass filter 164, and a VCO (voltage controlled oscillator) 121A. The oscillation frequency of the VCO 121A is divided into 1/N by the frequency divider 161. The phase comparator 162 compares phases between the frequency-divided signal and the reference signal. Here, the drive signal DRV generated by the oscillator 141A is used as the reference signal.

The result of phase comparison controls the output voltage of the charge pump 163, and the output voltage of the charge pump 163 is supplied to the VCO 121A after passing through the low-pass filter 164. This feedback control adjusts the oscillating frequency of the VCO 121A such that the phase comparison by the phase comparator indicates a zero phase difference. This makes it possible to generate the oscillating signal f+Δf synchronized with the drive signal DRV.

The VCO 121A includes the sensor capacitor C1 as a built-in element, and its oscillating frequency is f+Δf (Δf: frequency change responsive to a capacitor change). The cutoff frequency of the low-pass filter 164 of the PLL circuit is determined by taking into account frequency division by the frequency divider 161, such that the frequency change Δf passes through the low-pass filter 164 whereas the frequency f is blocked by the low-pass filter 164. With this provision, it is possible to generate a stable frequency f+Δf without having the PLL circuit absorbing the frequency change Δf responsive to a capacitance change through its synchronizing operation.

Figure 33:
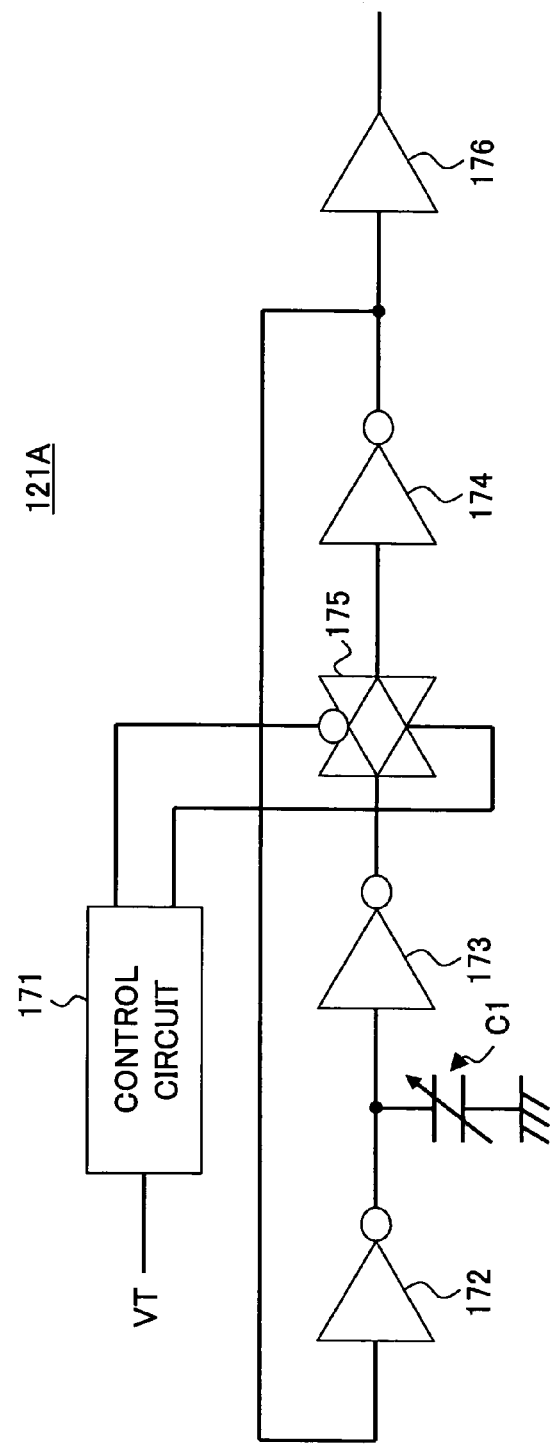
FIG. 33 is a circuit diagram showing an example of the construction of a VCO shown in FIG. 32.

FIG. 33 is a circuit diagram showing an example of the construction of the VCO shown in FIG. 32. The VCO of FIG. 33 includes a control circuit 171, inverters 172 through 174, an analog switch 175, and a buffer 176. The inverters 172 through 174 constitute a ring oscillator, which oscillates at predetermined frequency responsive to the capacitance C1. The oscillating signal is supplied to a subsequent stage through the buffer 176. The control circuit 171 receives the output voltage VT of the low-pass filter 164 shown in FIG. 32, and changes the ON resistance of the analog switch 175 in response to the voltage VT. This ON resistance change controls the delay of the oscillating signal inside the ring oscillator, thereby controlling the oscillating frequency.

With this provision, it is possible to achieve stable oscillation owing to the synchronization control of the PLL circuit while the oscillation has its frequency responsive to the capacitance C1.

Figure 34:
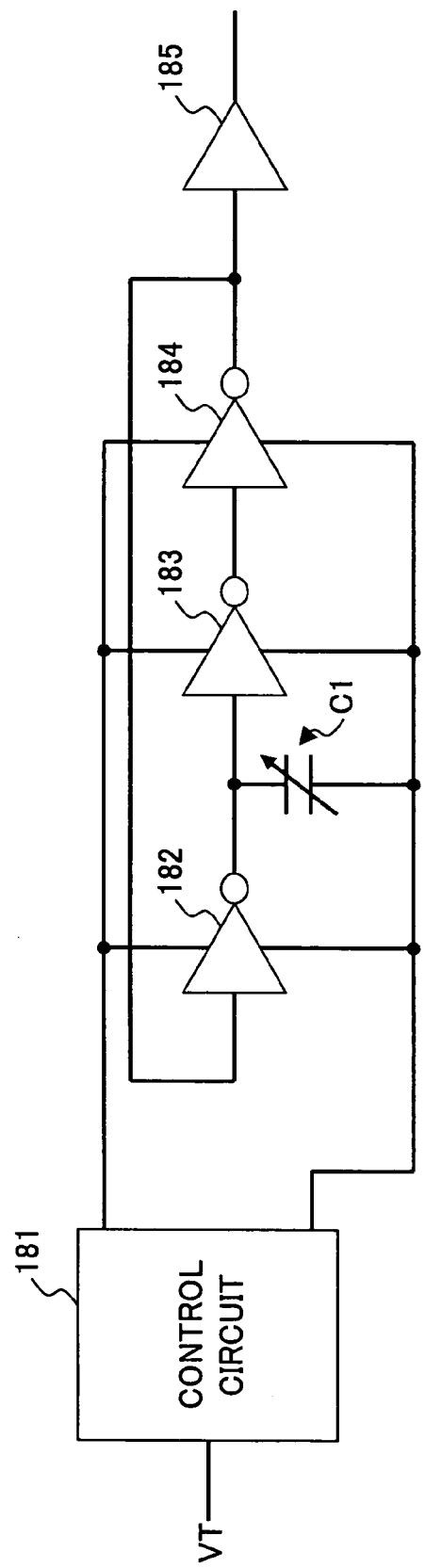
FIG. 34 is a circuit diagram showing another example of the construction of the VCO of FIG. 32.

FIG. 34 is a circuit diagram showing another example of the construction of the VCO of FIG. 32. The VCO of FIG. 34 includes a control circuit 181, inverters 182 through 184 with ON-resistance control functions, and a buffer 185. The inverters 182 through 184 make up a ring oscillator, which oscillates at predetermined frequency according to the capacitance C1. The oscillation signal is supplied to a subsequent stage through the buffer 185. The control circuit 181 receives the output voltage VT of the low-pass filter 164 shown in FIG. 32, and changes the ON resistances of the inverters 182 through 184 according to the voltage VT. These ON resistance changes control the delay of the oscillating signal inside the ring oscillator, thereby controlling the oscillating frequency. With this provision, it is possible to achieve stable oscillation owing to the synchronization control of the PLL circuit while the oscillation has its frequency responsive to the capacitance C1.

Further, the present invention is not limited to these embodiments, but various variations and modifications may be made without departing from the scope of the present invention.

What is claimed is:

1. A circuit for detecting a difference in capacitance between a first capacitor and a second capacitor provided in a sensor, comprising:
   an oscillator configured to generate an oscillating signal;
   a phase comparator coupled to said oscillator to output a signal responsive to a phase difference between the oscillating signal delayed by said first capacitor and the oscillating signal delayed by said second capacitor;
   a phase difference converting circuit coupled to said phase comparator to convert the phase difference into an electrical quantity;
   an integration circuit coupled to said phase difference converting circuit to output an integrated signal made by integrating the electrical quantity over a time period equal to a predetermined number of cycles of the oscillating signal;
   a sample-and-hold circuit coupled to said integration circuit to output a signal made by sampling and holding the integrated signal at substantially an end of said time period; and
   a reference signal circuit coupled between said integration circuit and said sample-and-hold circuit to return a level of the integrated signal to a reference level after the integrated signal is sampled and held by said sample-and-hold circuit.

2. The circuit as claimed in claim 1, further comprising:
   an oscillation circuit configured to generate a drive signal for driving the sensor;
   a control circuit coupled to said oscillation circuit to output a timing signal responsive to the drive signal; and
   a switchover circuit coupled to said control circuit to switch an effect of the oscillating signal delayed by said first capacitor and an effect of the oscillating signal delayed by said second capacitor on the sampled-and-held signal in response to the timing signal.

3. The circuit as claimed in claim 2, wherein said oscillator and said oscillation circuit are synchronized with each other, and said control circuit outputs a control signal responsive to the drive signal thereby to indicate timing of said time period by the control signal.

4. The circuit as claimed in claim 2, further comprising a block circuit, wherein said oscillator and said oscillation circuit are synchronized with each other, and said control circuit outputs a stop signal responsive to the drive signal, said block circuit configured to block temporarily an effect of the oscillating signal on the sampled-and-held signal in response to the stop signal.

* * * * *